United States Patent
Lille et al.

(10) Patent No.: US 10,249,683 B1
(45) Date of Patent: Apr. 2, 2019

(54) THREE-DIMENSIONAL PHASE CHANGE MEMORY ARRAYS AND METHODS OF MANUFACTURING THE SAME

(71) Applicant: SANDISK TECHNOLOGIES LLC, Plano, TX (US)

(72) Inventors: Jeffrey S. Lille, Sunnyvale, CA (US); Timothy J. Minvielle, San Jose, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 15/843,777

(22) Filed: Dec. 15, 2017

(51) Int. Cl.
  *H01L 27/00* (2006.01)
  *H01L 45/00* (2006.01)
  *H01L 27/24* (2006.01)

(52) U.S. Cl.
  CPC ............ *H01L 27/249* (2013.01); *H01L 45/06* (2013.01); *H01L 45/1226* (2013.01); *H01L 45/1246* (2013.01); *H01L 45/1683* (2013.01); *H01L 27/2436* (2013.01); *H01L 45/1253* (2013.01); *H01L 45/144* (2013.01)

(58) Field of Classification Search
  CPC ............... H01L 27/249; H01L 27/2436; H01L 27/4227; H01L 27/2463; H01L 45/06; H01L 45/1226; H01L 45/1246; H01L 45/1683; H01L 45/1253; H01L 45/144
  See application file for complete search history.

(56) References Cited

U.S. PATENT DOCUMENTS

| 8,173,987 | B2 * | 5/2012 | Lung ............... G11C 13/0004 257/2 |
| 8,345,472 | B2 | 1/2013 | Lee et al. |
| 8,349,681 | B2 | 1/2013 | Alsmeier et al. |
| 8,912,519 | B2 * | 12/2014 | Lee ................... H01L 45/085 257/1 |
| 9,230,979 | B1 | 1/2016 | Pachamuthu et al. |

(Continued)

FOREIGN PATENT DOCUMENTS

| WO | WO 2007-004843 A1 | 1/2007 |
| WO | WO 2015-138314 A1 | 9/2015 |

OTHER PUBLICATIONS

Kau, D.C. et al., "A Stackable Cross Point Phase Change Memory," IEEE, IEDM09, pp. 617-620, (2009).

(Continued)

*Primary Examiner* — Nikolay K Yushin
(74) *Attorney, Agent, or Firm* — The Marbury Law Group PLLC

(57) ABSTRACT

A phase change memory device containing a phase change memory material layer includes a vertically repeating sequence of unit layer stacks located over a substrate, a plurality of openings vertically extending through the vertically repeating sequence, a plurality of vertical bit lines located within a respective one of the plurality of openings, and vertical stacks of insulating spacers. Each of the unit layer stacks includes an insulating layer, at least one of the phase change memory material layer or a threshold switch material layer, and an electrically conductive word line layer. Each of the insulating spacers laterally surrounds a respective one of the plurality of vertical bit lines, and contacts a sidewall of a respective one of the electrically conductive word line layers.

29 Claims, 27 Drawing Sheets

(56) References Cited

U.S. PATENT DOCUMENTS

| | | | |
|---|---|---|---|
| 9,343,507 B2 | 5/2016 | Takaki | |
| 9,583,615 B2 | 2/2017 | Chen et al. | |
| 9,698,202 B2 | 7/2017 | Takaki | |
| 2008/0200003 A1 | 8/2008 | Hong et al. | |
| 2010/0270529 A1* | 10/2010 | Lung | G11C 13/0004 257/4 |
| 2012/0147648 A1 | 6/2012 | Scheuerlein | |
| 2012/0155161 A1 | 6/2012 | Lee et al. | |
| 2013/0043455 A1 | 2/2013 | Bateman | |
| 2013/0221309 A1* | 8/2013 | Lee | H01L 45/085 257/2 |
| 2015/0263074 A1 | 9/2015 | Takaki | |
| 2016/0240665 A1 | 8/2016 | Chen et al. | |
| 2016/0260775 A1 | 9/2016 | Takaki | |

OTHER PUBLICATIONS

Wong, H. S. P. et al., "Phase Change Memory," Proceedings of the IEEE, vol. 98, No. 12, pp. 2201-2227, (2010).

Xactix, Inc., "Isotropic Etching with Xenon Difluoride," https://wcam.engr.wisc.edu/Public/Reference/PlasmaEtch/XACTIX%20XeF2%20Presentation,pdf, view date Dec. 11, 2017.

U.S. Appl. No. 15/478,637, filed Apr. 4, 2017, SanDisk Technologies LLC.

U.S. Appl. No. 15/637,357, filed Jun. 29, 2017, SanDisk Technologies LLC.

U.S. Appl. No. 15/672,929, filed Aug. 9, 2017, SanDisk Technologies LLC.

U.S. Appl. No. 15/844,005, filed Dec. 15, 2017, SanDisk Technologies LLC.

* cited by examiner

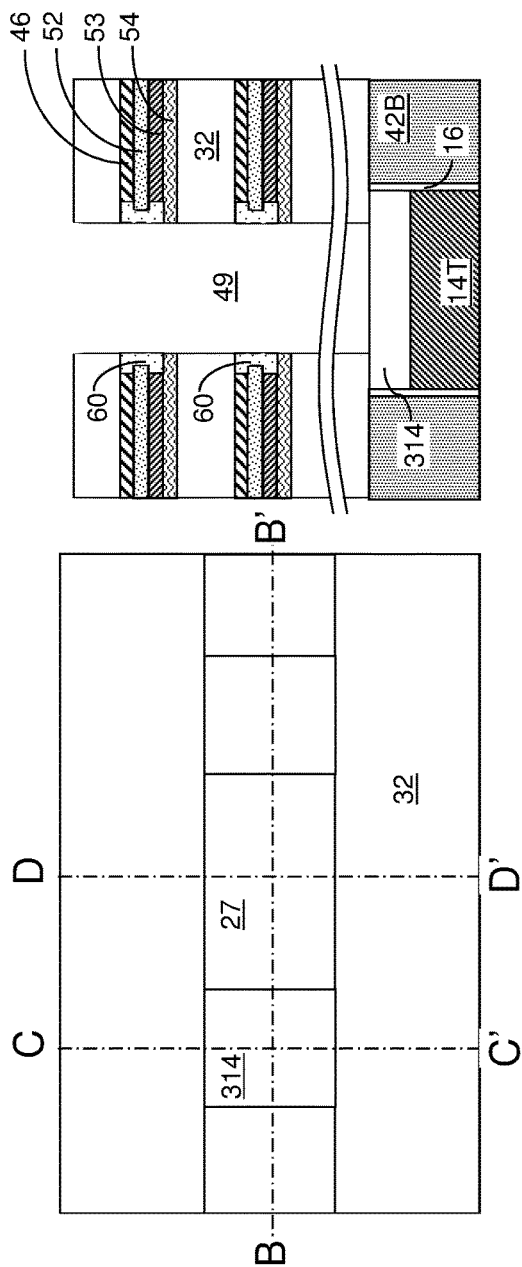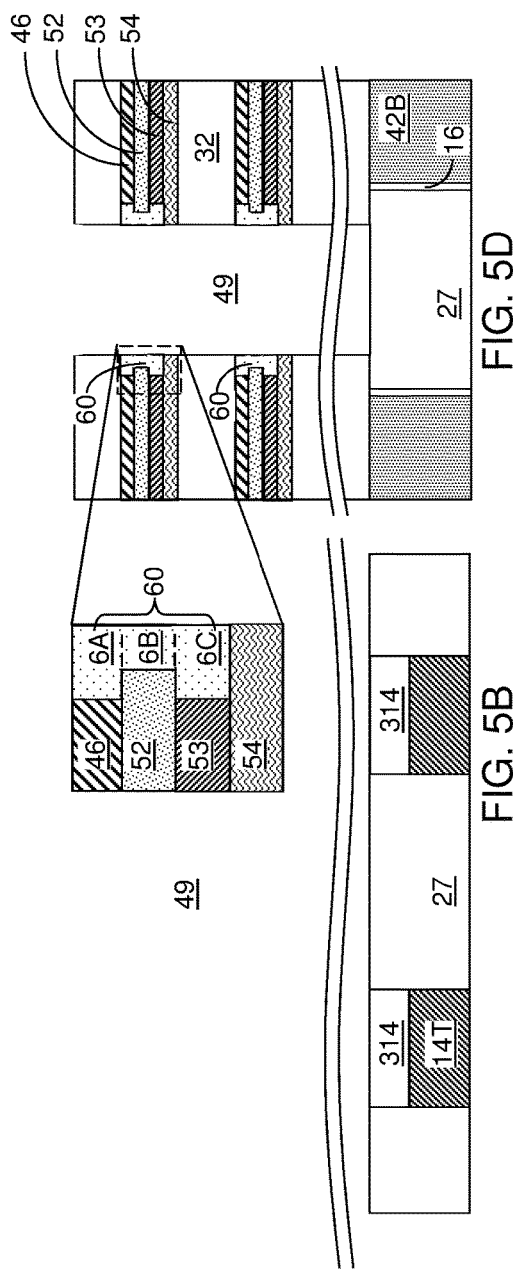

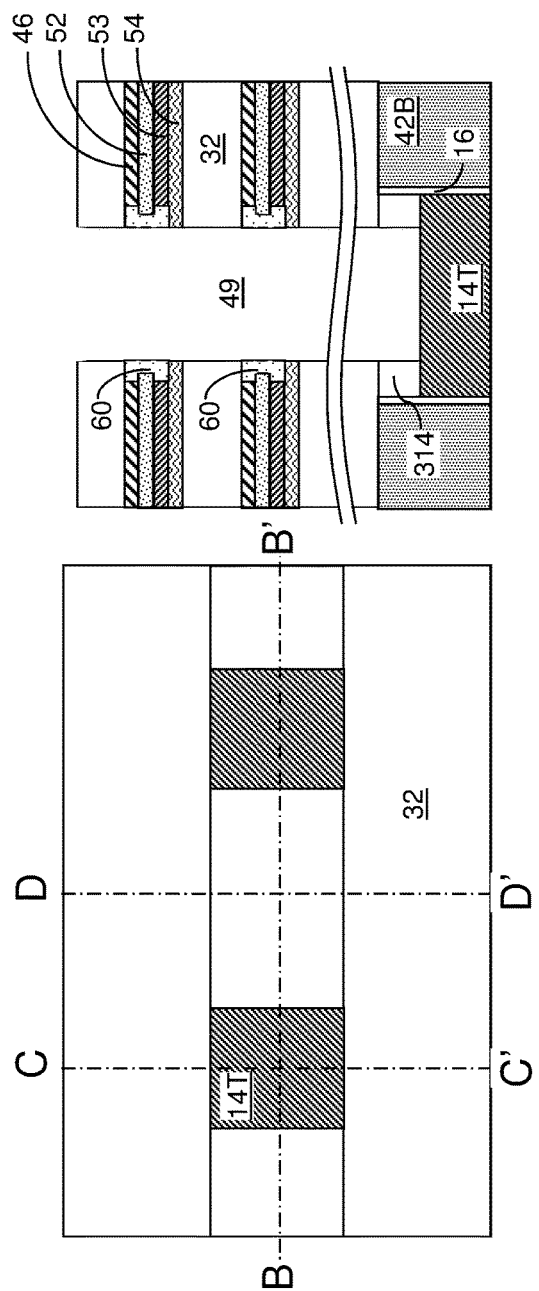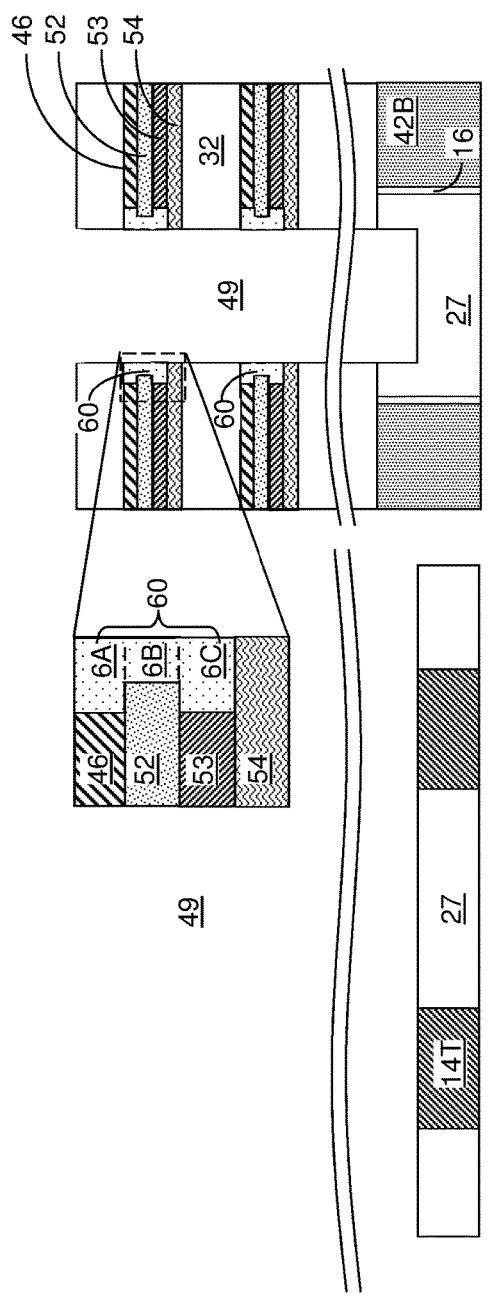

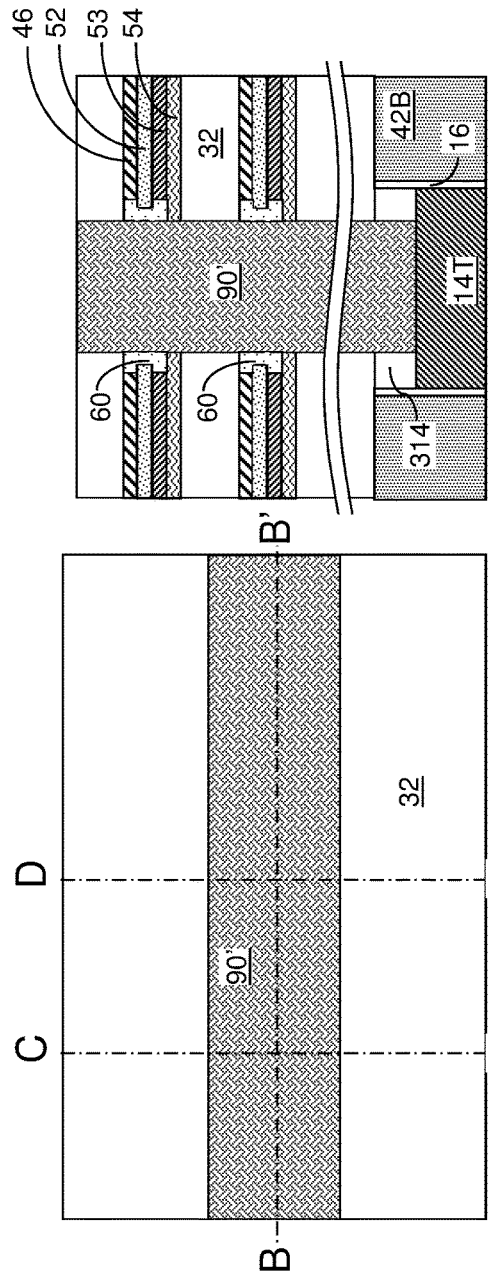
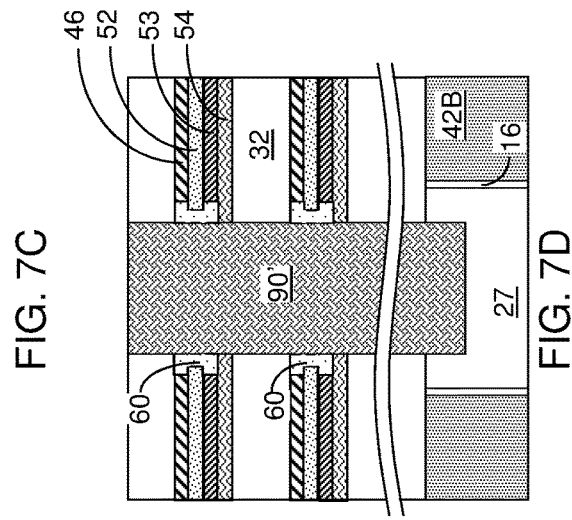
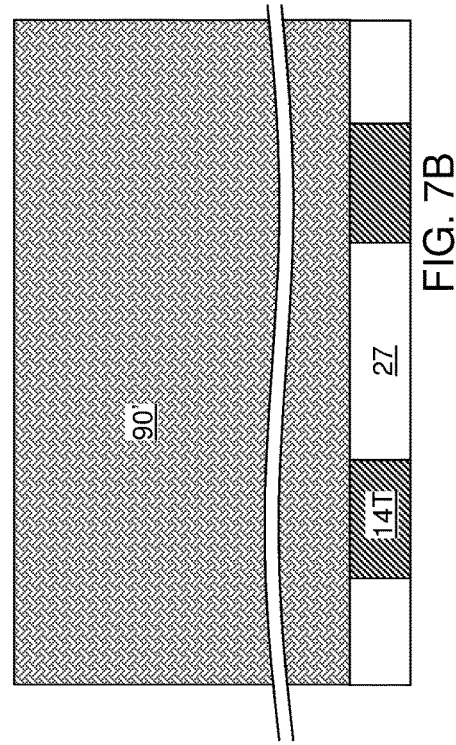
FIG. 7A
FIG. 7B
FIG. 7C
FIG. 7D

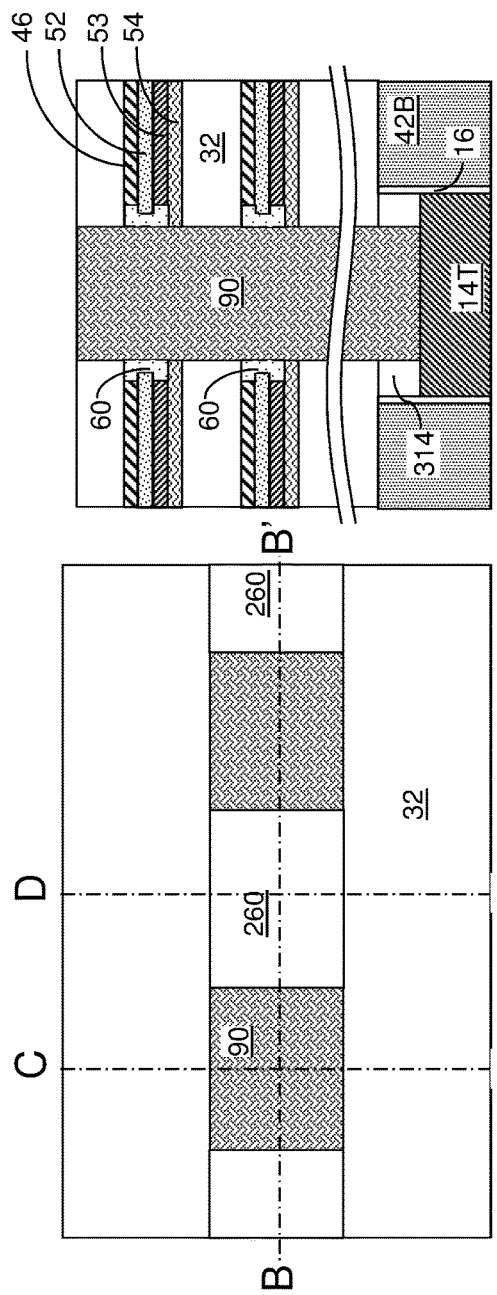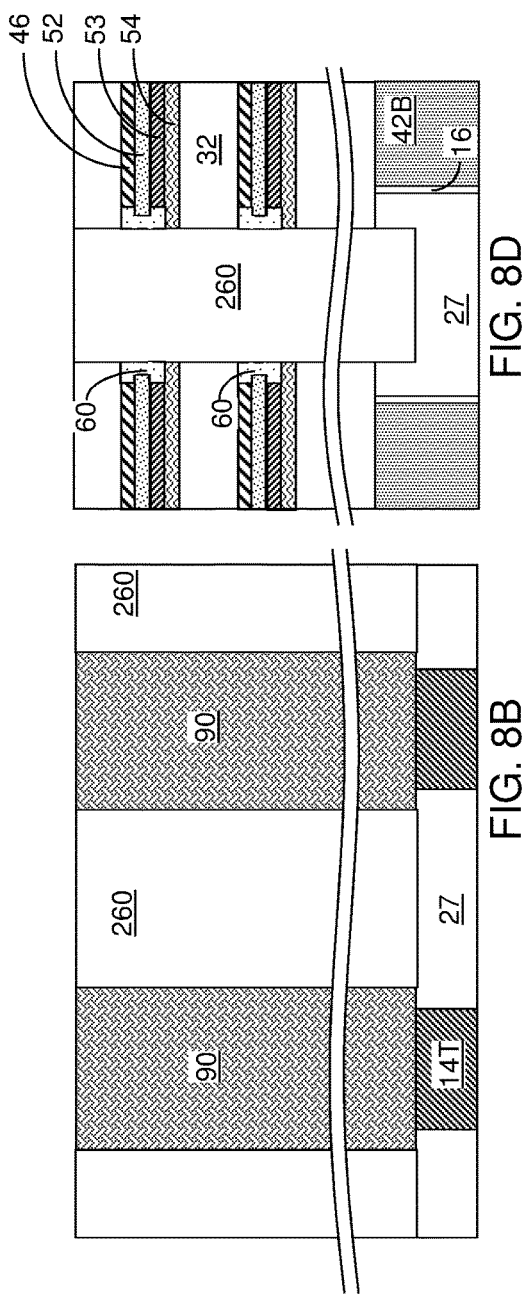

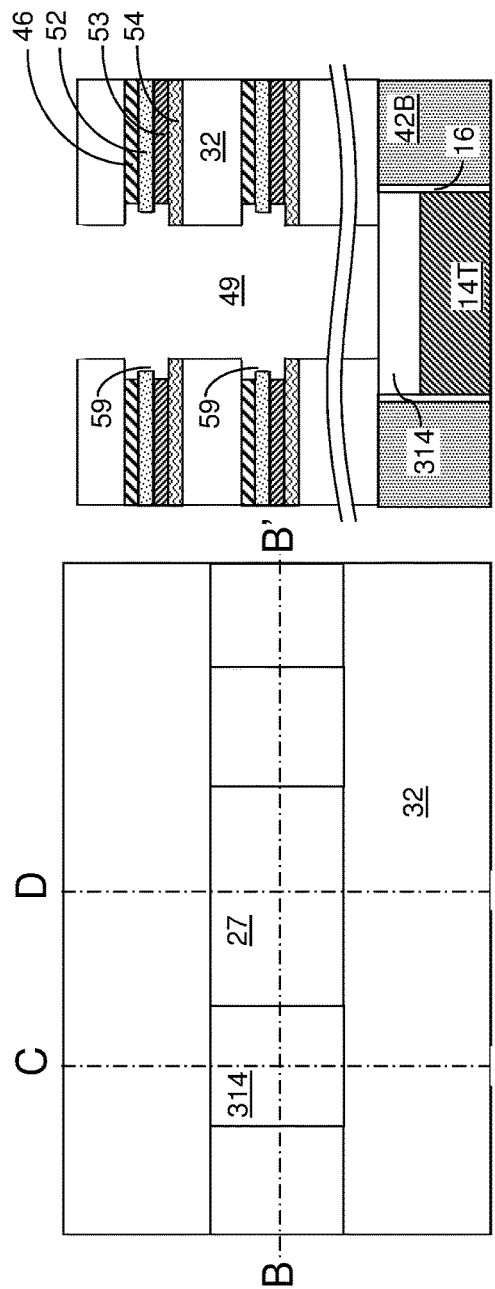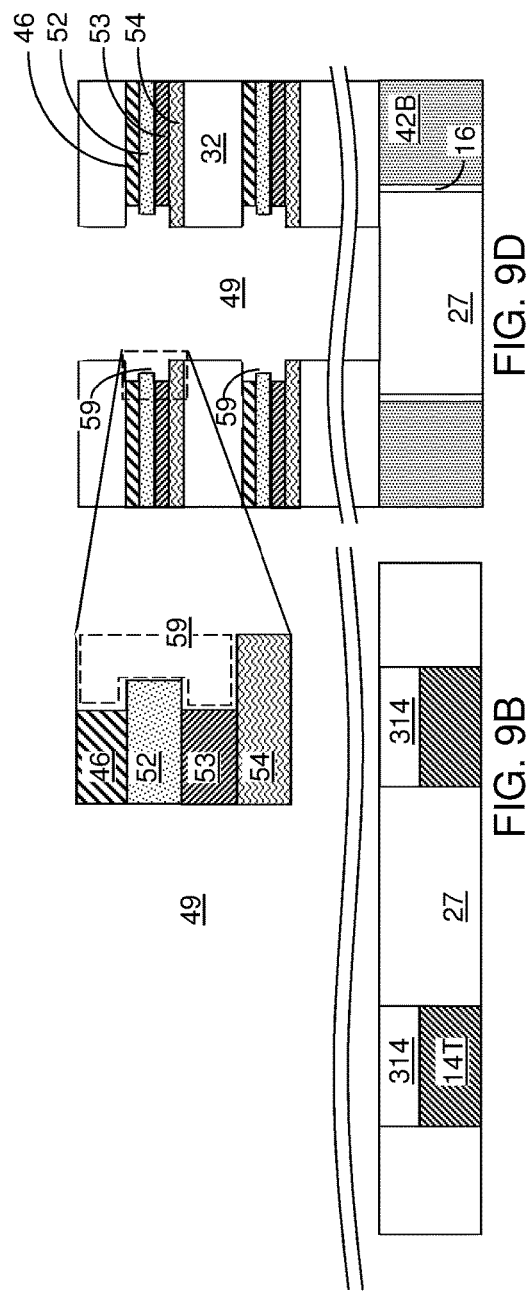

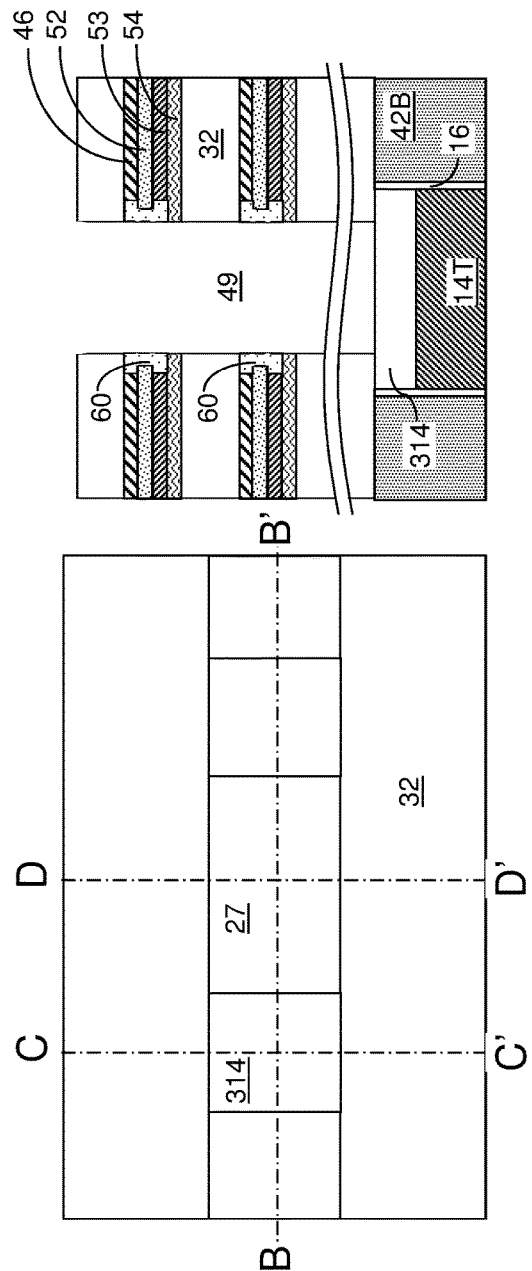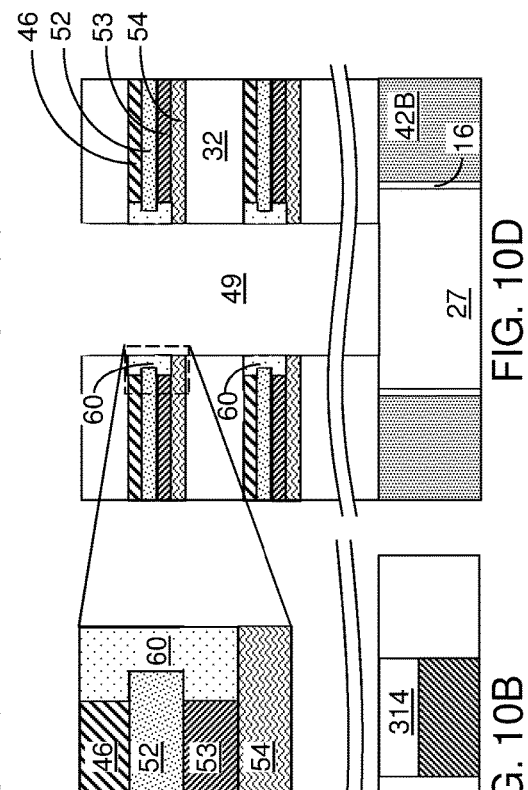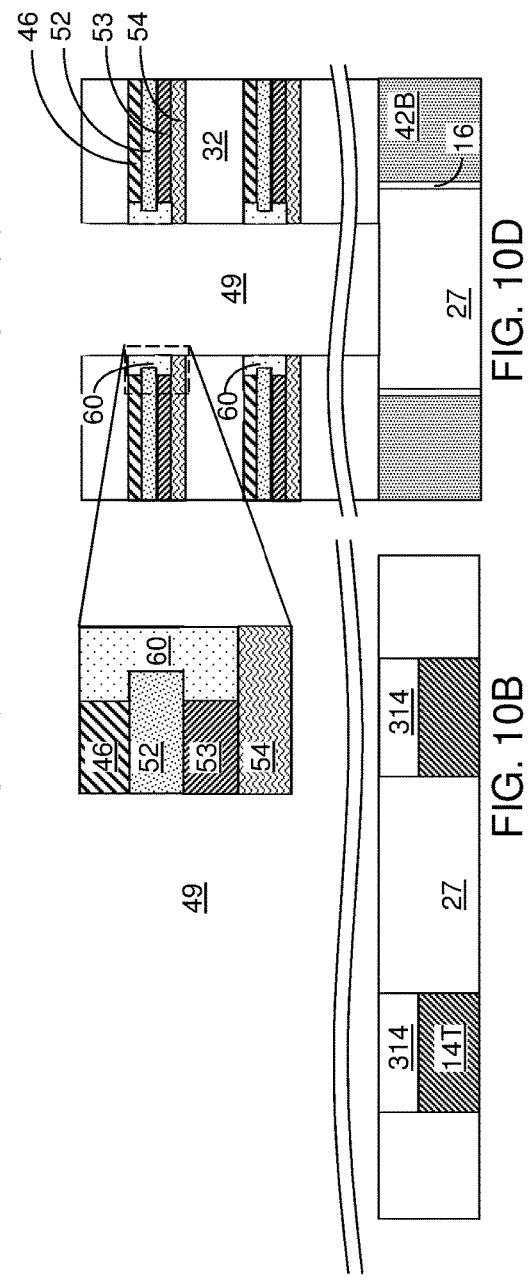

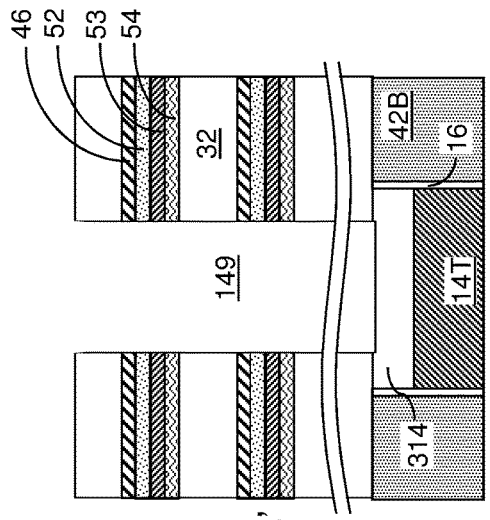
FIG. 11C
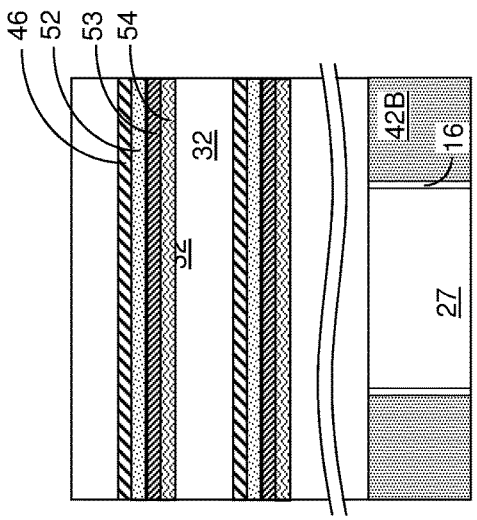
FIG. 11D
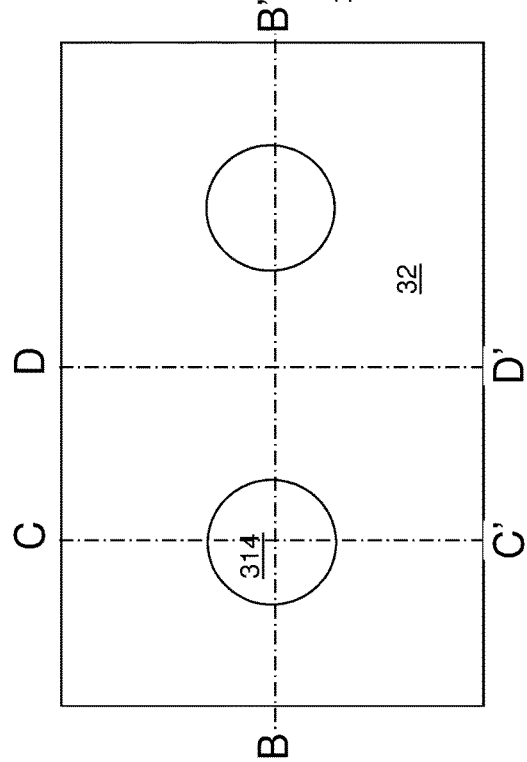
FIG. 11A
FIG. 11B
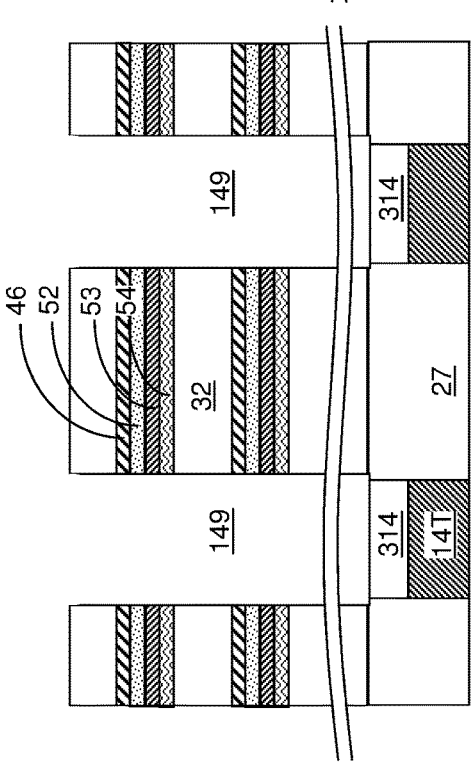

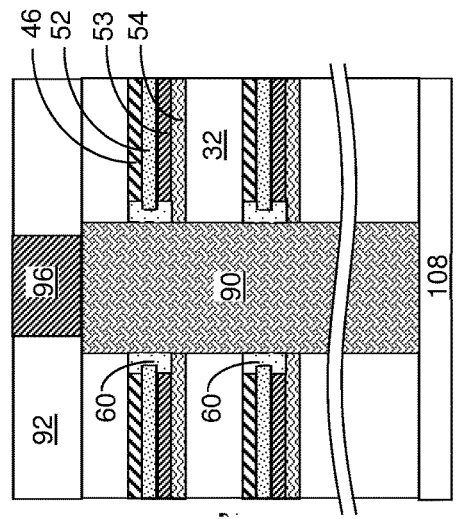
FIG. 13C
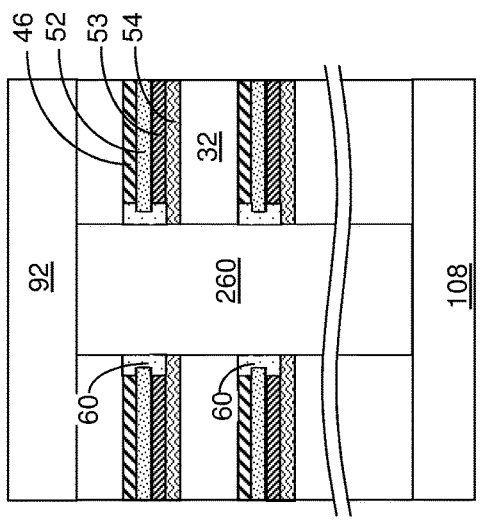
FIG. 13D
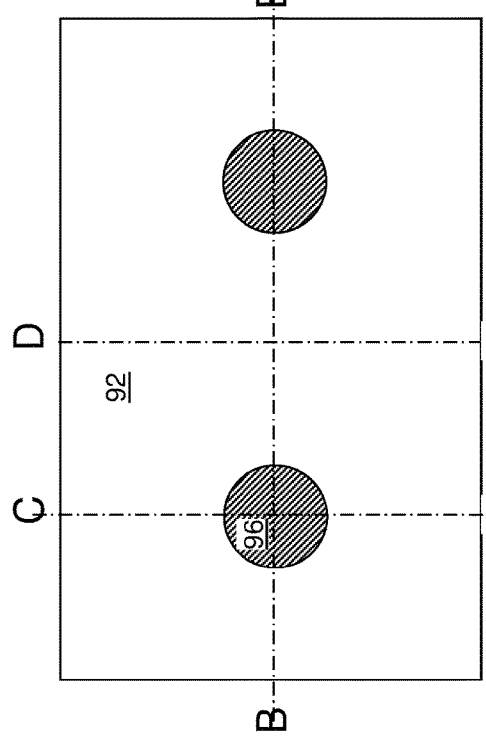
FIG. 13A
FIG. 13B
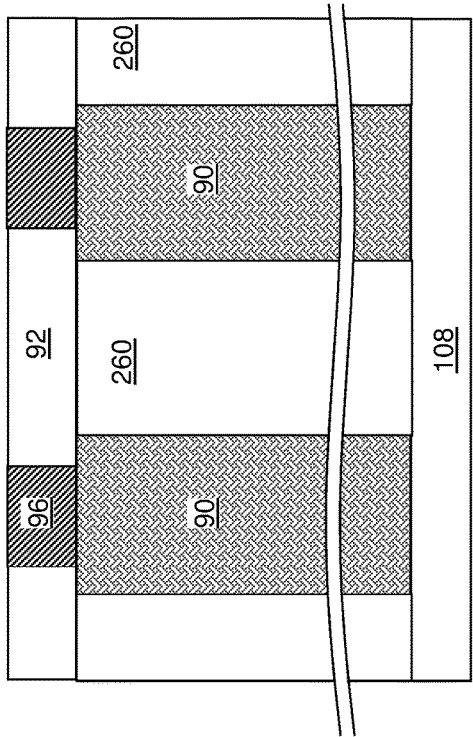

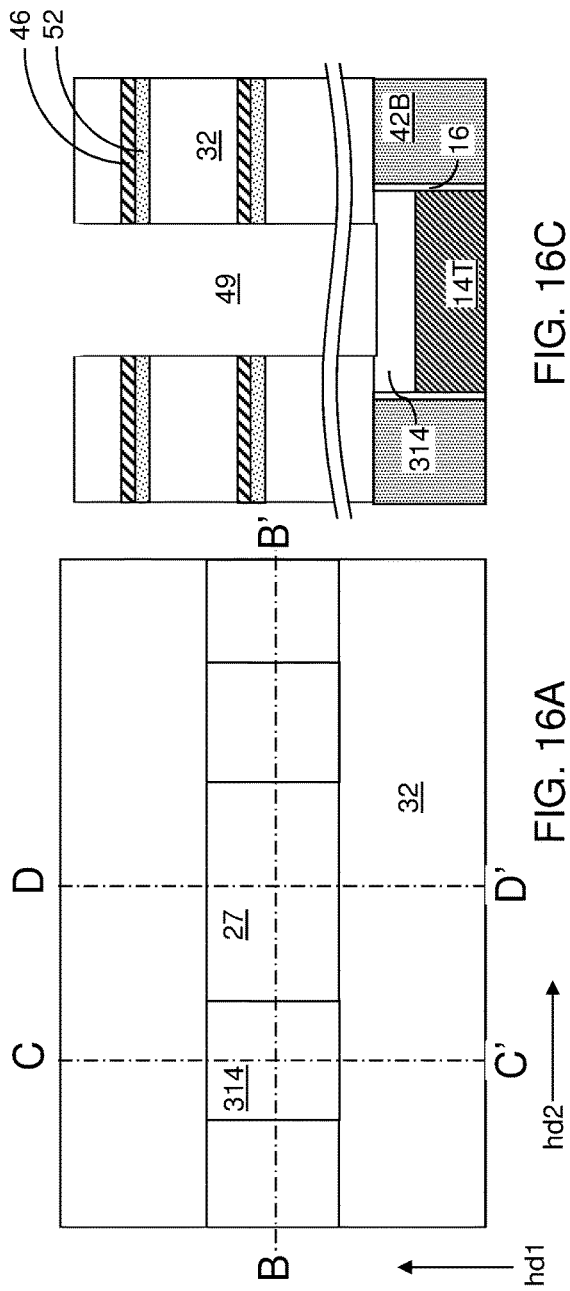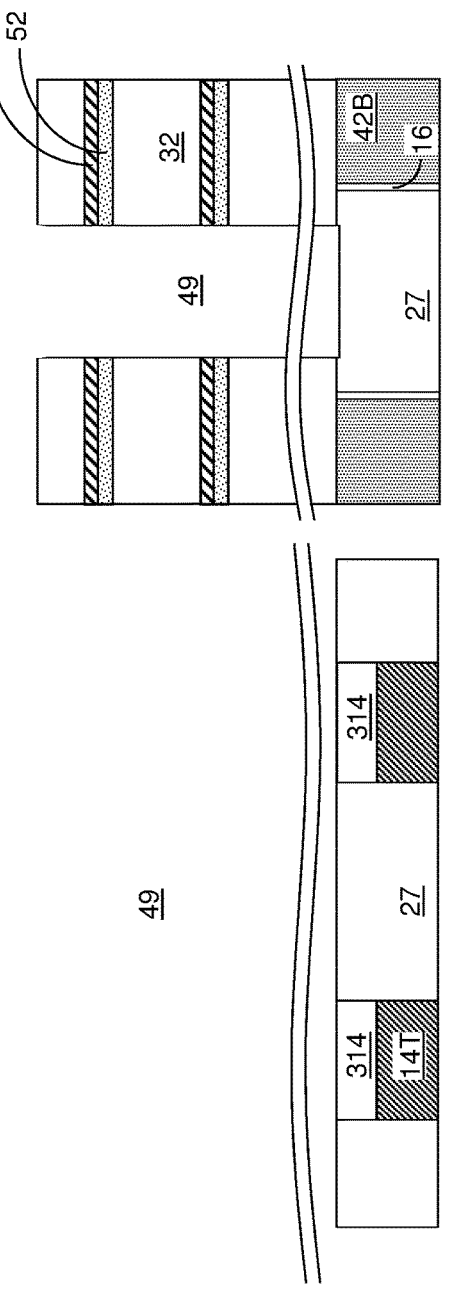

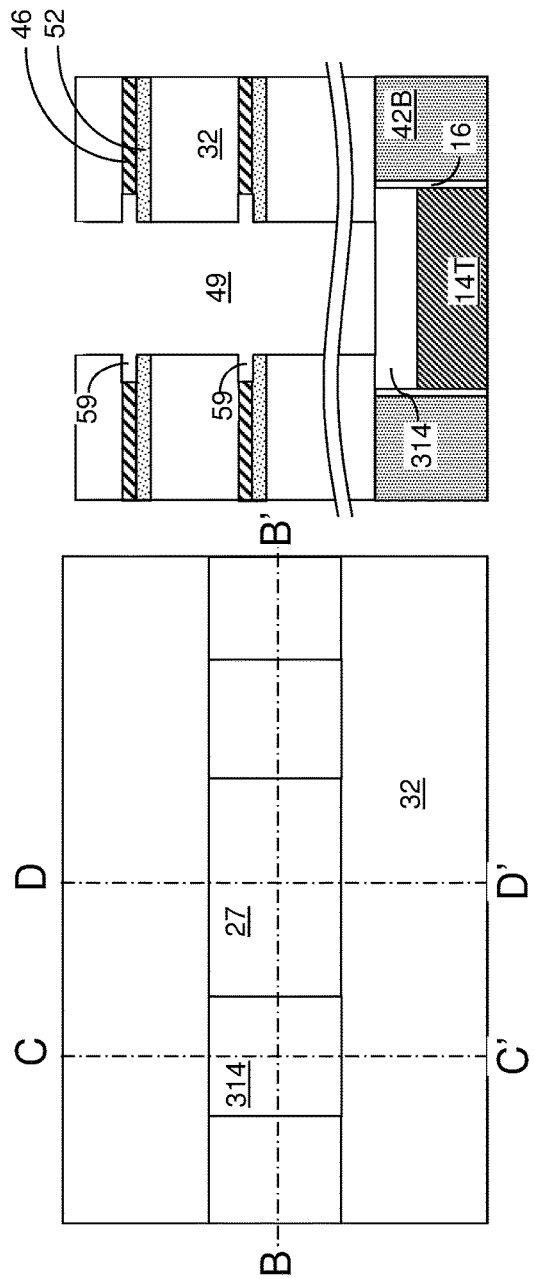
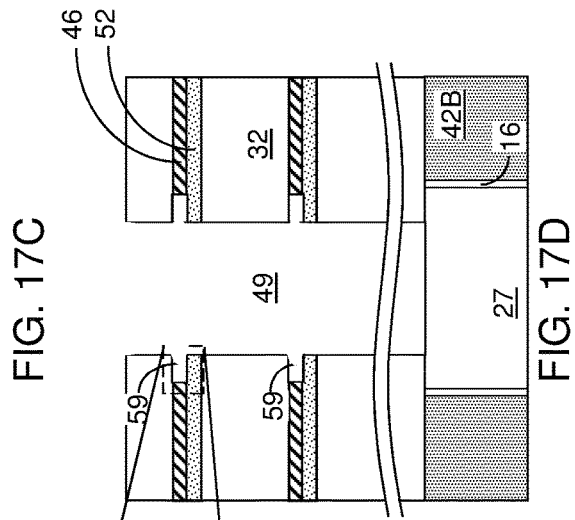
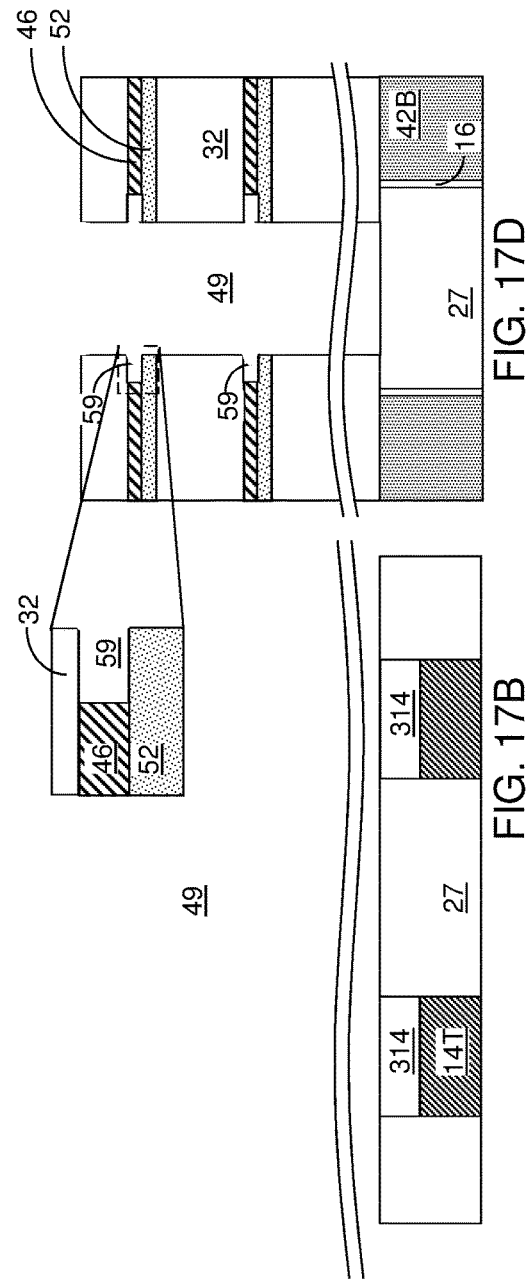
FIG. 17A  FIG. 17B  FIG. 17C  FIG. 17D

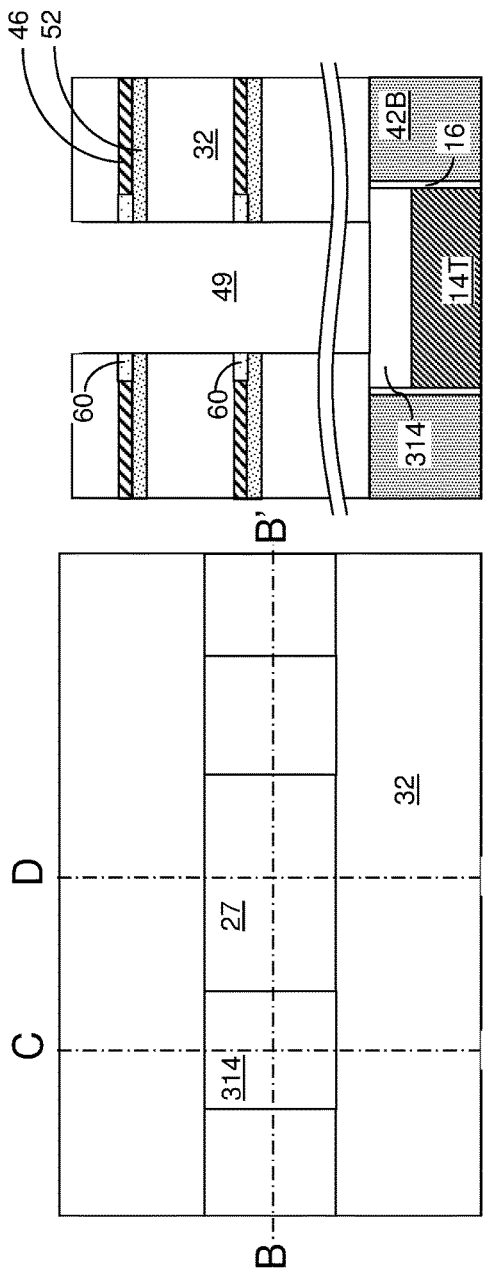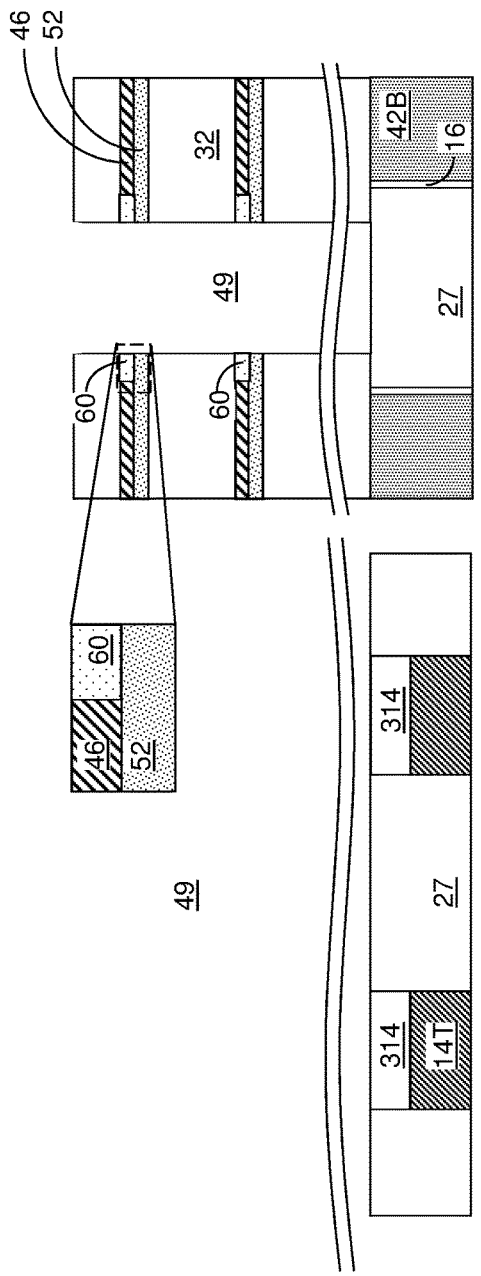
FIG. 18A  FIG. 18B  FIG. 18C  FIG. 18D

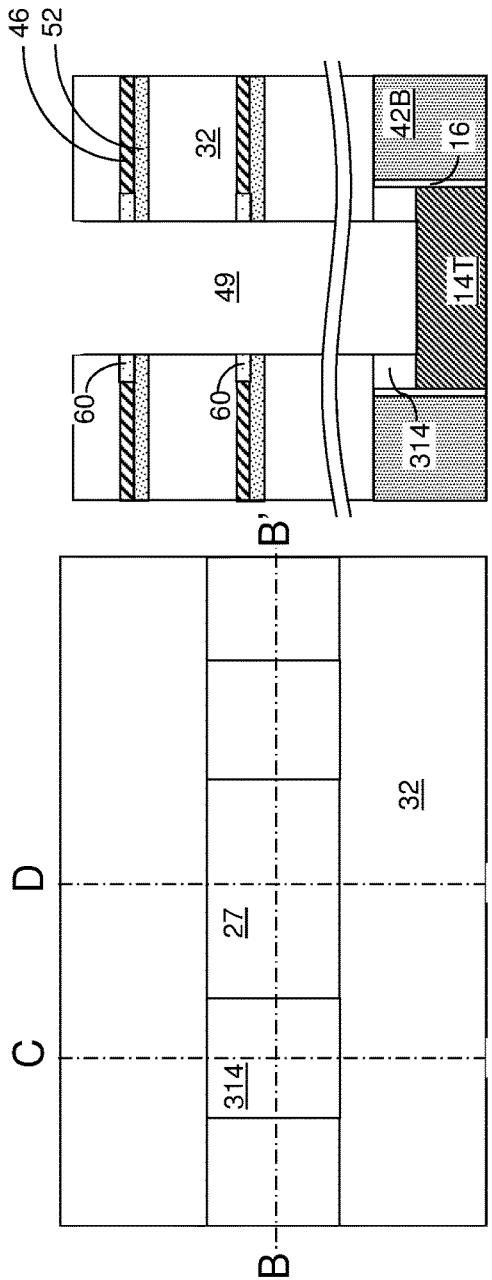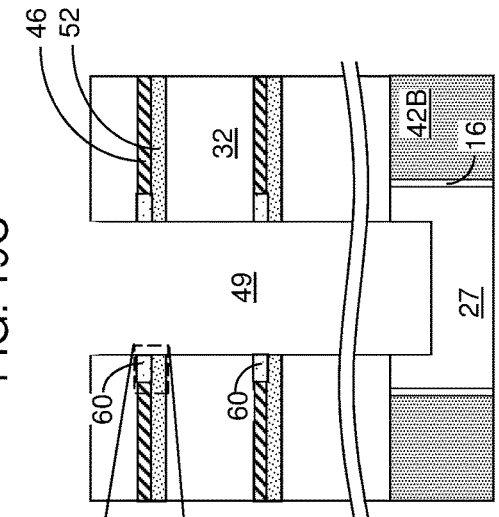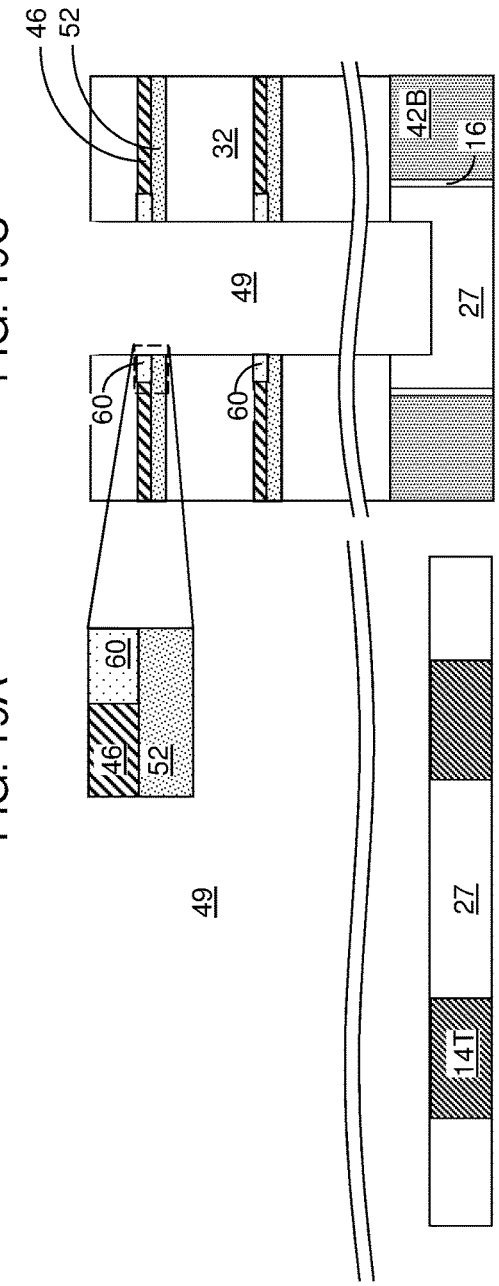

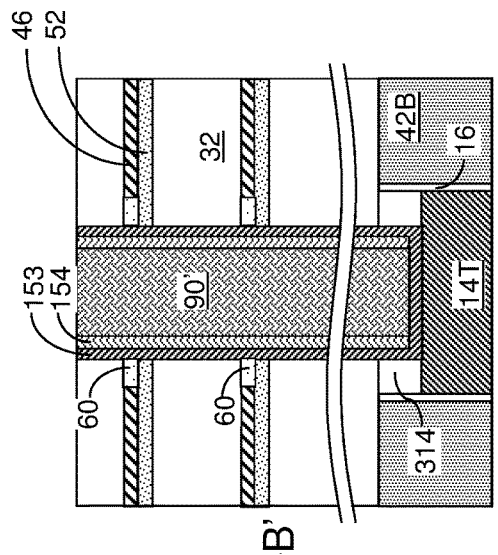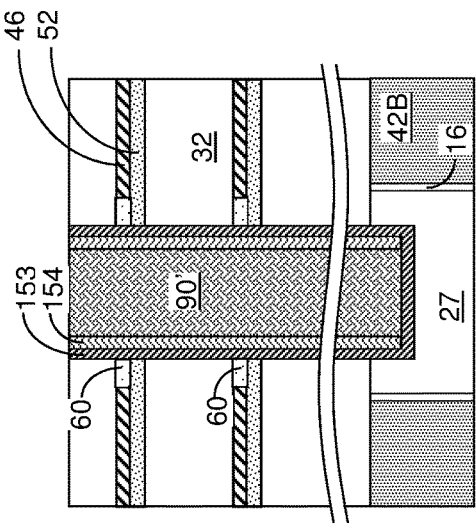
FIG. 20C  FIG. 20D
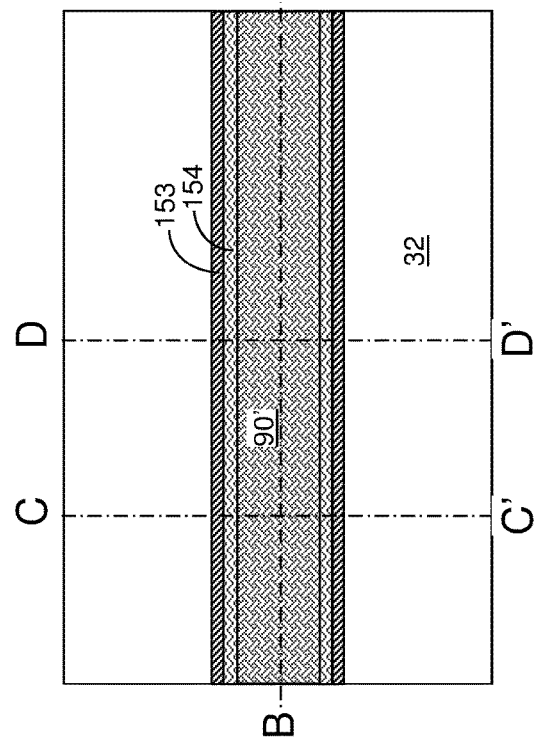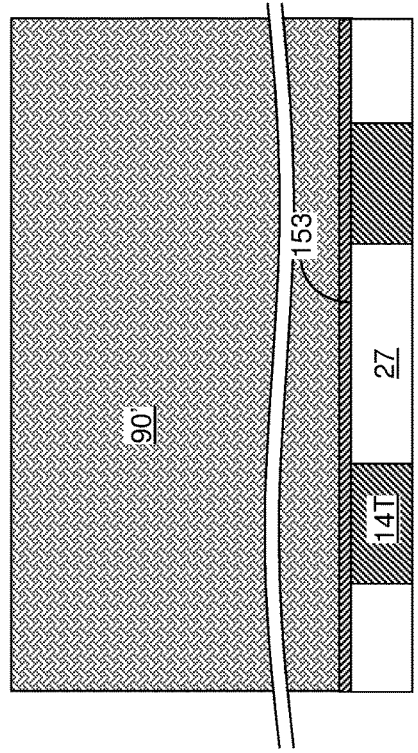
FIG. 20A  FIG. 20B

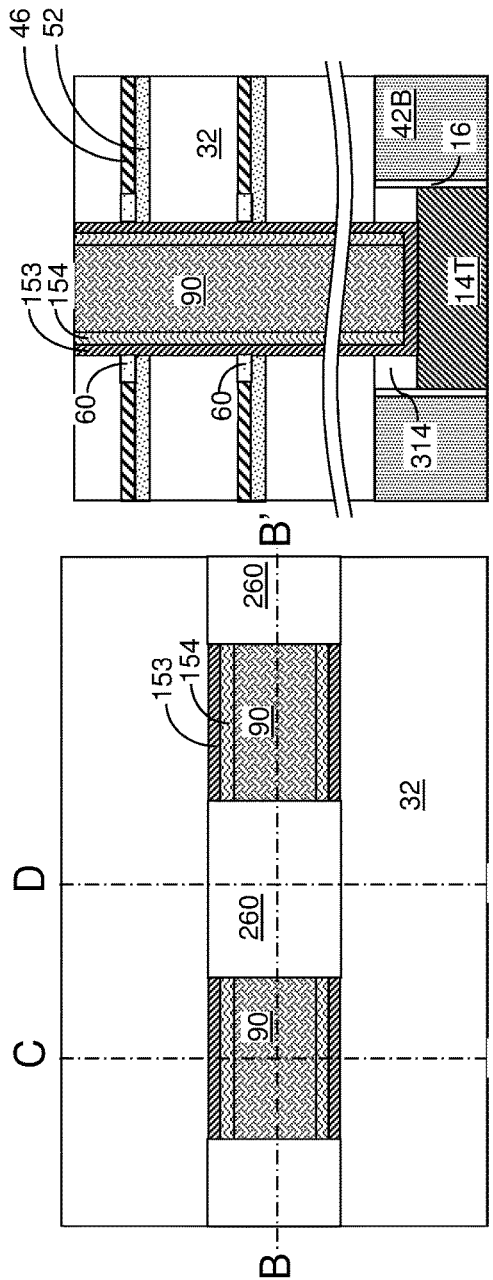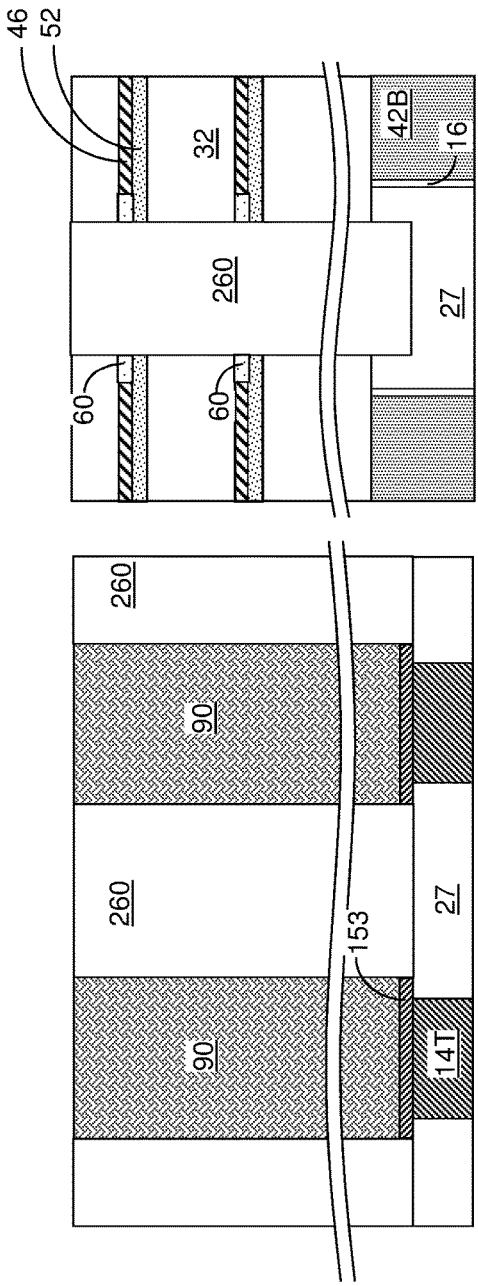

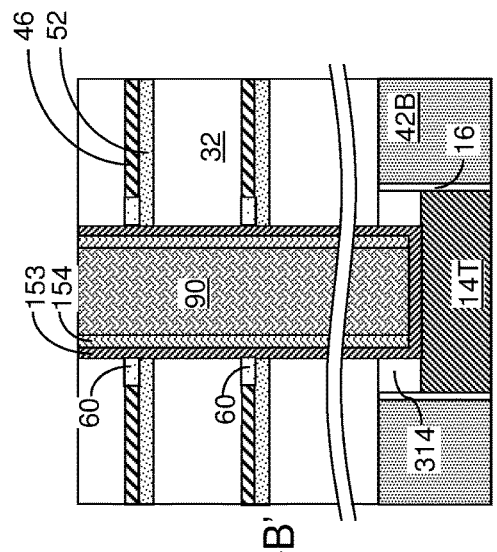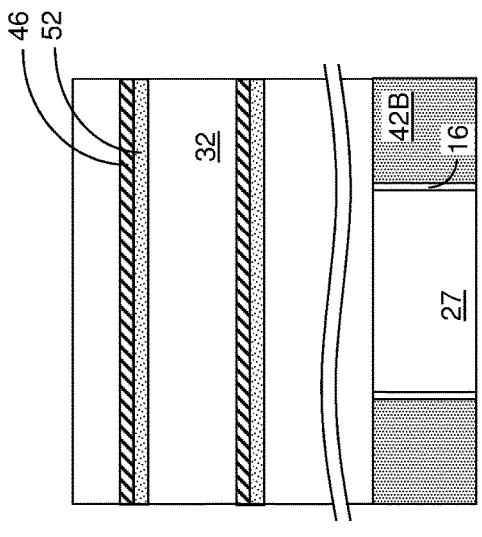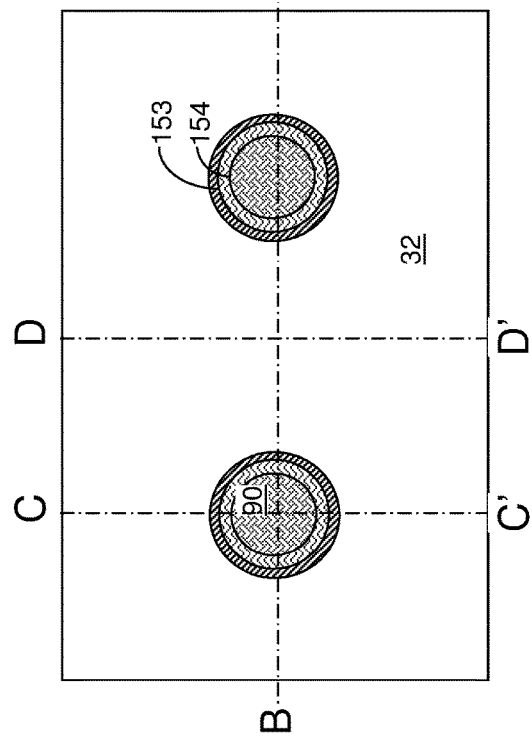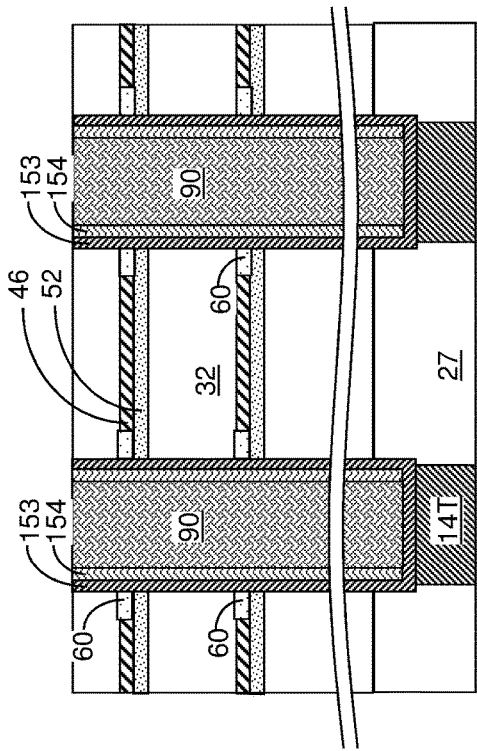
FIG. 23A  FIG. 23C
FIG. 23B  FIG. 23D

US 10,249,683 B1

THREE-DIMENSIONAL PHASE CHANGE MEMORY ARRAYS AND METHODS OF MANUFACTURING THE SAME

FIELD

The present disclosure relates generally to the field of semiconductor devices and specifically to three-dimensional phase change memory devices and methods of manufacturing the same.

BACKGROUND

A phase change material (PCM) memory device is a type of non-volatile memory device that stores information as a resistive state of a material that can be in different resistive states corresponding to different phases of the material. The different phases can include an amorphous state having high resistivity and a crystalline state having low resistivity (i.e., a lower resistivity than in the amorphous state). The transition between the amorphous state and the crystalline state can be induced by controlling the rate of cooling after application of an electrical pulse that renders the phase change memory material in a first part of a programming process. The second part of the programming process includes control of the cooling rate of the phase change memory material. If rapid quenching occurs, the phase change memory material can cool into an amorphous high resistivity state. If slow cooling occurs, the phase change memory material can cool into a crystalline low resistivity state.

SUMMARY

According to an aspect of the present disclosure, a phase change memory device containing a phase change memory material layer includes a vertically repeating sequence of unit layer stacks located over a substrate, a plurality of openings vertically extending through the vertically repeating sequence, a plurality of vertical bit lines located within a respective one of the plurality of openings, and vertical stacks of insulating spacers. Each of the unit layer stacks includes an insulating layer, at least one of the phase change memory material layer or a threshold switch material layer, and an electrically conductive word line layer. Each of the insulating spacers laterally surrounds a respective one of the plurality of vertical bit lines, and contacts a sidewall of a respective one of the electrically conductive word line layers.

According to another aspect of the present disclosure, a method of manufacturing a phase change memory device containing a phase change memory material layer comprises forming a vertically repeating sequence of unit layer stacks over a substrate, wherein each of the unit layer stacks comprises an insulating layer, at least one of the phase change memory material layer or a threshold switch material layer, and an electrically conductive word line layer, forming a plurality of openings vertically extending through the vertically repeating sequence of unit layer stacks, forming vertical stacks of insulating spacers around the plurality of openings at levels of the electrically conductive word line layers, wherein each of the insulating spacers contacts sidewalls of a respective one of the electrically conductive word line layers, and forming a plurality of vertical bit lines located within a respective one of the plurality of openings.

BRIEF DESCRIPTION OF THE DRAWINGS

FIG. 5A is a top-down view of the first exemplary structure after formation of insulating spacers by anodization according to the first embodiment of the present disclosure.

FIG. 5B is a vertical cross-sectional view along the vertical plane B-B' of FIG. 5A.

FIG. 5C is a vertical cross-sectional view along the vertical plane C-C' of FIG. 5A.

FIG. 5D is a vertical cross-sectional view along the vertical plane D-D' of FIG. 5A.

FIG. 6A is a top-down view of the first exemplary structure after vertically extending the line trenches according to the first embodiment of the present disclosure.

FIG. 6B is a vertical cross-sectional view along the vertical plane B-B' of FIG. 6A.

FIG. 6C is a vertical cross-sectional view along the vertical plane C-C' of FIG. 6A.

FIG. 6D is a vertical cross-sectional view along the vertical plane D-D' of FIG. 6A.

FIG. 7A is a top-down view of the first exemplary structure after formation of an electrically conductive rail in each line trench according to the first embodiment of the present disclosure.

FIG. 7B is a vertical cross-sectional view along the vertical plane B-B' of FIG. 7A.

FIG. 7C is a vertical cross-sectional view along the vertical plane C-C' of FIG. 7A.

FIG. 7D is a vertical cross-sectional view along the vertical plane D-D' of FIG. 7A.

FIG. 8A is a top-down view of the first exemplary structure after formation of dielectric pillar structures that divide the electrically conductive rails into vertical bit lines according to the first embodiment of the present disclosure.

FIG. 8B is a vertical cross-sectional view along the vertical plane B-B' of FIG. 8A.

FIG. 8C is a vertical cross-sectional view along the vertical plane C-C' of FIG. 8A.

FIG. 8D is a vertical cross-sectional view along the vertical plane D-D' of FIG. 8A.

FIG. 9A is a top-down view of a first alternative embodiment of the first exemplary structure after formation of lateral recesses by laterally recessing sidewalls of the electrically conductive layers selective to the phase change memory material layers according to the first embodiment of the present disclosure.

FIG. 9B is a vertical cross-sectional view along the vertical plane B-B' of FIG. 9A.

FIG. 9C is a vertical cross-sectional view along the vertical plane C-C' of FIG. 9A.

FIG. 9D is a vertical cross-sectional view along the vertical plane D-D' of FIG. 9A.

FIG. 10A is a top-down view of the first alternative embodiment of the first exemplary structure after formation of insulating spacers according to the first embodiment of the present disclosure.

FIG. 10B is a vertical cross-sectional view along the vertical plane B-B' of FIG. 10A.

FIG. 10C is a vertical cross-sectional view along the vertical plane C-C' of FIG. 10A.

FIG. 10D is a vertical cross-sectional view along the vertical plane D-D' of FIG. 10A.

FIG. 11A is a top-down view of a second alternative embodiment of the first exemplary structure after formation of discrete openings through the vertically repeating sequence of unit layer stacks according to the first embodiment of the present disclosure.

FIG. 11B is a vertical cross-sectional view along the vertical plane B-B' of FIG. 11A.

FIG. 11C is a vertical cross-sectional view along the vertical plane C-C' of FIG. 11A.

FIG. 11D is a vertical cross-sectional view along the vertical plane D-D' of FIG. 11A.

FIG. 13A is a top-down view of a third alternative embodiment of the first exemplary structure according to the first embodiment of the present disclosure.

FIG. 13B is a vertical cross-sectional view along the vertical plane B-B' of FIG. 13A.

FIG. 13C is a vertical cross-sectional view along the vertical plane C-C' of FIG. 13A.

FIG. 13D is a vertical cross-sectional view along the vertical plane D-D' of FIG. 13A.

FIG. 16A is a top-down view of region M of the second exemplary structure of FIG. 15.

FIG. 16B is a vertical cross-sectional view along the vertical plane B-B' of FIG. 16A.

FIG. 16C is a vertical cross-sectional view along the vertical plane C-C' of FIG. 16A.

FIG. 16D is a vertical cross-sectional view along the vertical plane D-D' of FIG. 16A.

FIG. 17A is a top-down view of the second exemplary structure after formation of lateral recesses according to the second embodiment of the present disclosure.

FIG. 17B is a vertical cross-sectional view along the vertical plane B-B' of FIG. 17A.

FIG. 17C is a vertical cross-sectional view along the vertical plane C-C' of FIG. 17A.

FIG. 17D is a vertical cross-sectional view along the vertical plane D-D' of FIG. 17A.

FIG. 18A is a top-down view of the second exemplary structure after formation of insulating spacers by conformal deposition of an insulating material and anisotropic etch according to the second embodiment of the present disclosure.

FIG. 18B is a vertical cross-sectional view along the vertical plane B-B' of FIG. 18A.

FIG. 18C is a vertical cross-sectional view along the vertical plane C-C' of FIG. 18A.

FIG. 18D is a vertical cross-sectional view along the vertical plane D-D' of FIG. 18A.

FIG. 19A is a top-down view of the second exemplary structure after vertically extending the line trenches according to the second embodiment of the present disclosure.

FIG. 19B is a vertical cross-sectional view along the vertical plane B-B' of FIG. 19A.

FIG. 19C is a vertical cross-sectional view along the vertical plane C-C' of FIG. 19A.

FIG. 19D is a vertical cross-sectional view along the vertical plane D-D' of FIG. 19A.

FIG. 20A is a top-down view of the second exemplary structure after formation of an ovonic threshold switch material layer and an electrically conductive rail in each line trench according to the second embodiment of the present disclosure.

FIG. 20B is a vertical cross-sectional view along the vertical plane B-B' of FIG. 20A.

FIG. 20C is a vertical cross-sectional view along the vertical plane C-C' of FIG. 20A.

FIG. 20D is a vertical cross-sectional view along the vertical plane D-D' of FIG. 20A.

FIG. 21A is a top-down view of the second exemplary structure after formation of dielectric pillar structures that divide the electrically conductive rails into vertical bit lines according to the second embodiment of the present disclosure.

FIG. 21B is a vertical cross-sectional view along the vertical plane B-B' of FIG. 21A.

FIG. 21C is a vertical cross-sectional view along the vertical plane C-C' of FIG. 21A.

FIG. 21D is a vertical cross-sectional view along the vertical plane D-D' of FIG. 21A.

FIG. 23A is a top-down view of the first alternative embodiment of the second exemplary structure after formation of an ovonic threshold switch material layer and a vertical bit line in each opening according to the second embodiment of the present disclosure.

FIG. 23B is a vertical cross-sectional view along the vertical plane B-B' of FIG. 23A.

FIG. 23C is a vertical cross-sectional view along the vertical plane C-C' of FIG. 23A.

FIG. 23D is a vertical cross-sectional view along the vertical plane D-D' of FIG. 23A.

DETAILED DESCRIPTION

Figure 1A:
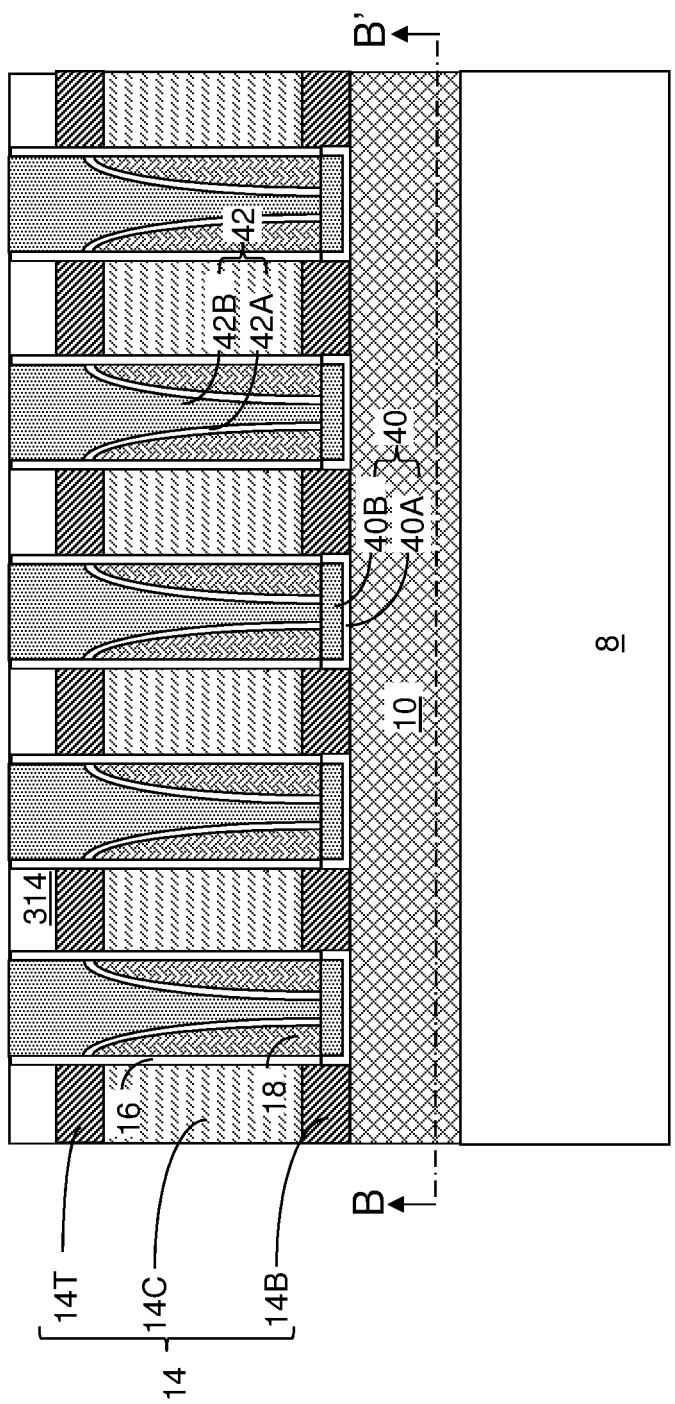
FIG. 1A is a vertical cross-sectional view of a first exemplary structure after formation of vertical bit line access transistors and dielectric fill layers according to an embodiment of the present disclosure.

The embodiments of the present disclosure provide three-dimensional PCM memory devices and methods of manufacturing the same, the various aspects of which are described below. The PCM memory devices of the embodiments of the present disclosure can be arranged in high density, three-dimensional PCM memory array in which multiple PCM memory devices are arranged in an array configuration that allows selection of each individual PCM memory device for data storage and data retrieval. Further, the volume of each PCM portion is preferably minimized with sufficient thermal insulation for the PCM portion to provide efficient programming of each PCM cell without consuming excessive electrical power for programming. Thus, a PCM memory device design of embodiments of the present disclosure can reduce the volume of a unit cell and provide efficient programming with small programming current.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. Elements with a same reference numeral refer to a same element or similar elements, and are presumed to have the same composition thereamongst unless otherwise specified.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, and/or may have one or more layer thereupon, thereabove, and/or therebelow. As used herein, a "layer stack" refers to a stack of layers. As used herein, a "line" or a "line structure" refers to a layer that has a predominant direction of extension, i.e., having a direction along which the layer extends the most.

As used herein, a "field effect transistor" refers to any semiconductor device having a semiconductor channel through which electrical current flows with a current density modulated by an external electrical field. As used herein, an "active region" refers to a source region of a field effect transistor or a drain region of a field effect transistor. A "top active region" refers to an active region of a field effect transistor that is located above another active region of the field effect transistor. A "bottom active region" refers to an active region of a field effect transistor that is located below another active region of the field effect transistor.

As used herein, a "semiconducting material" refers to a material having electrical conductivity in the range from $1.0 \times 10^{-6}$ S/cm to $1.0 \times 10^{5}$ S/cm. As used herein, a "semiconductor material" refers to a material having electrical conductivity in the range from $1.0 \times 10^{-6}$ S/cm to $1.0 \times 10^{5}$ S/cm in the absence of electrical dopants therein, and is capable of producing a doped material having electrical conductivity in a range from 1.0 S/cm to $1.0 \times 10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/cm. As used herein, an "insulator material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material, i.e., to have electrical conductivity greater than $1.0 \times 10^{5}$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^{5}$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

Figure 1B:
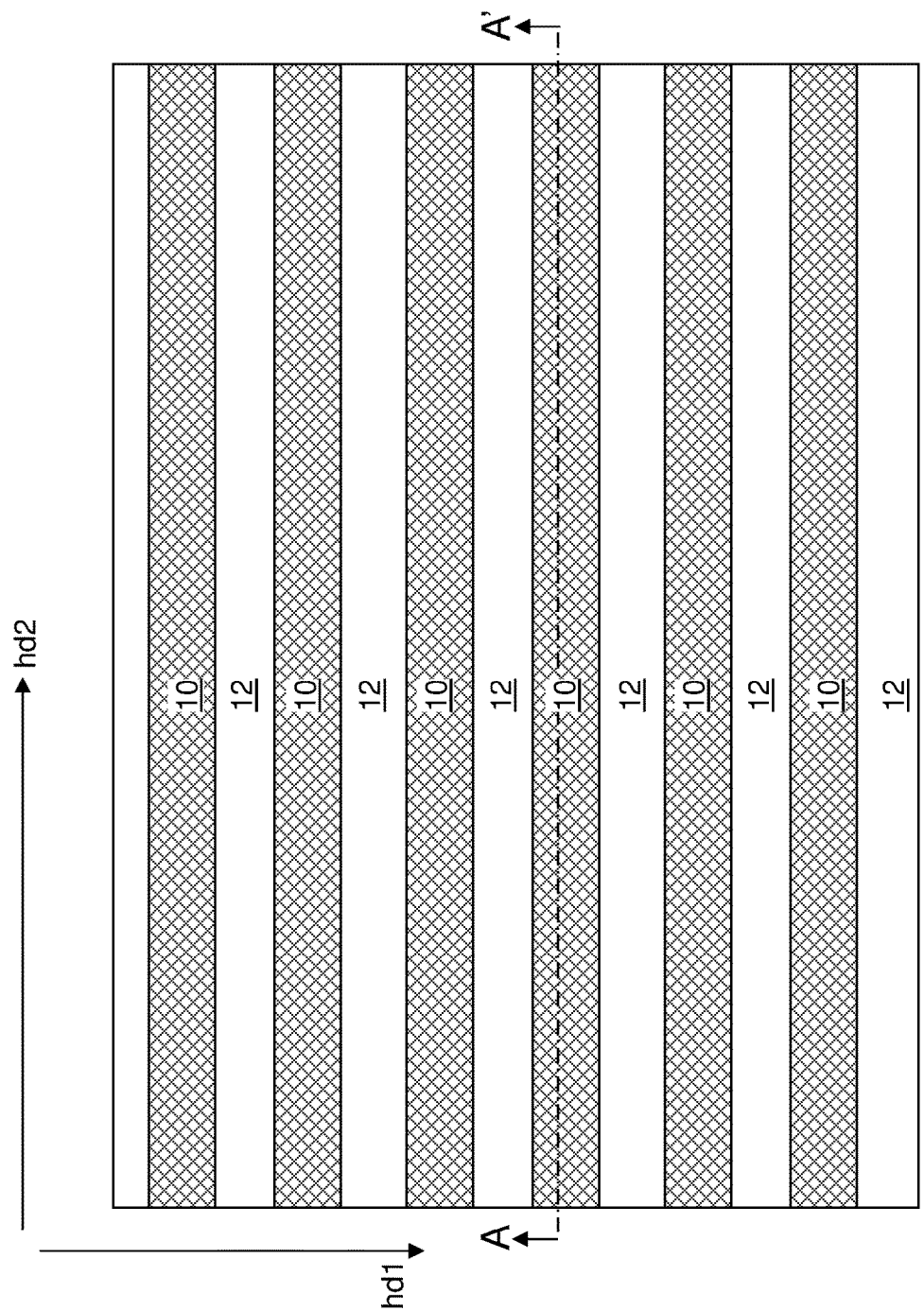
FIG. 1B is a horizontal cross-sectional view of the first exemplary structure of FIG. 1A along the horizontal plane B-B' of FIG. 1A.
Figure 1C:
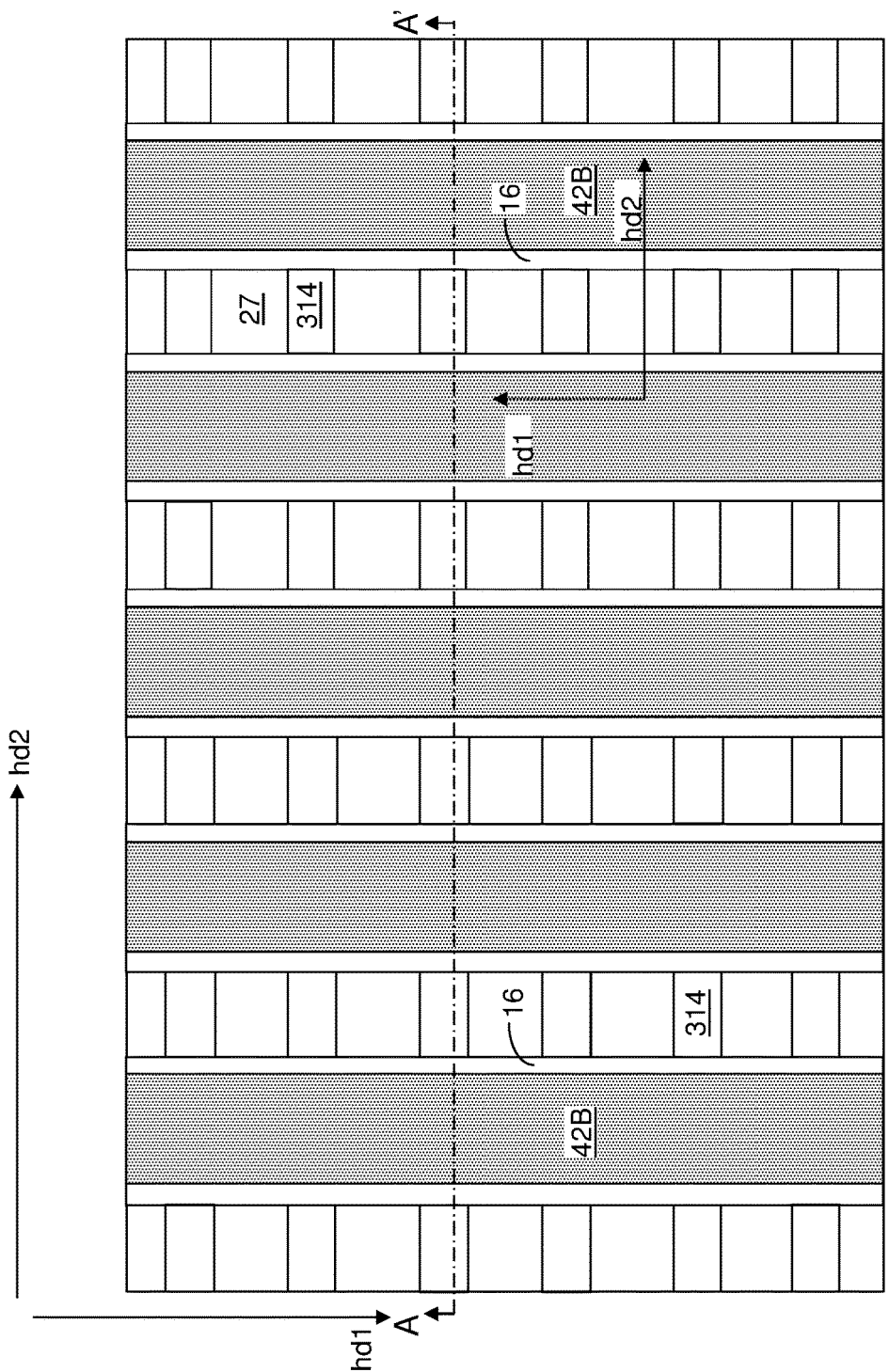
FIG. 1C is a top-down view of the first exemplary structure of FIG. 1A. The vertical plane A-A' is the plane of the cross-section for FIG. 1A.

Referring to FIGS. 1A-1C, a first exemplary structure according to a first embodiment of the present disclosure is illustrated, which can be an in-process phase change memory device. The phase change memory device has three-dimensional vertical bit line ("VBL") type device configuration. As used herein, a "prototype" structure or an "in-process" structure refers to a transient structure that is subsequently modified in the shape or composition of at least one component therein.

The first exemplary structure includes a substrate 8, which includes an insulating layer at an upper portion thereof. In one embodiment, the substrate 8 can be a stack of at least two material layers such as a stack of an underlying substrate material layer and an overlying substrate insulating layer. The substrate material layer can be a semiconductor material layer, an electrically conductive layer, or an insulating material layer that can provide structural support to the overlying structures, and may have a thickness greater than 50 microns, and typically in a range between 300 microns and 3 mm. In one embodiment, the substrate material layer can be a semiconductor wafer, such as a silicon wafer as known in the art. The substrate insulating layer can include an insulating material, and can have a thickness in a range from 100 nm to 3 microns, although lesser and greater thicknesses can also be employed.

In case the substrate material layer includes a semiconductor material, peripheral semiconductor devices for operation of a memory array device can be formed in, or on, the substrate material layer. For example, sense amplifiers, input-output (I/O) circuitry, control circuitry, and any other necessary peripheral circuitry can be formed on, or in, the substrate material layer. Additional devices that can be formed in, or on, the substrate material layer include, but are not limited to, global vertical bit line select transistors for selecting global vertical bit lines to be activated, local vertical bit line select transistors for selecting local vertical bit lines to be activated, and word line select transistor for selecting word lines to be activated.

Global vertical bit lines 10 are formed over the substrate 8. The global vertical bit lines 10 are parallel electrically conductive lines that are laterally spaced apart in a first horizontal direction hd1, and extending in a second horizontal direction hd2. The global vertical bit lines 10 can be formed, for example, by depositing at least one electrically conductive layer, and patterning the at least one electrically conductive layer employing a combination of lithographic methods and an anisotropic etch.

The at least one electrically conductive layer can include, for example, at least one elemental metal (such as W, Co, Cu, and Al), a conductive doped semiconductor material, an intermetallic alloy including at least two elemental metals, a conductive metallic nitride, or a conductive metallic carbide. For example, the at least one electrically conductive layer can include a metallic barrier layer (such as a layer of TiN, TaN, or WN) and a metal layer (such as a layer of W, Ti, Ta, Cu, Al, or an alloy thereof). The space between the global vertical bit lines 10 can be filled with a dielectric material (such as silicon oxide). The dielectric material can be subsequently planarized to remove excess portions from above a horizontal plane including the top surfaces of the global vertical bit lines 10 to form separator dielectric material portions 12. Each global vertical bit lines 10 and each separator dielectric material portions 12 can extend along the second horizontal direction hd2.

A one-dimensional array of the global vertical bit lines 10 and the separator dielectric material portions 12 can extend along the first horizontal direction hd2 with a periodicity that is equal to the sum of the width of a global vertical bit line 10 and the width of a separator dielectric material portion 12. Alternatively, the one-dimensional array of the global vertical bit lines 10 and the separator dielectric material portions 12 may be formed by depositing a dielectric material layer, forming trenches extending along the second horizontal direction hd2 and laterally spaced from one another along the first horizontal direction hd1, and filling the trenches with at least one conductive material to form the global vertical bit lines 10 therein.

A two-dimensional array of select devices can be formed on the global vertical bit lines 10 such that multiple select devices are formed on each global vertical bit line 10. In one embodiment, the select devices can be transistor such as vertical thin film transistors employing a polycrystalline semiconductor channel Examples of suitable transistors for the select devices are described, for example, in U.S. Pat. No. 9,343,507, which is incorporated by reference herein in its entirety. In case the select devices are field effect transistors, the select transistors are herein referred to access transistors.

Vertical bit line access transistors are subsequently formed on global vertical bit line 10. Each access transistor can be a vertical field effect transistor, and can include a bottom active region 14B (which can be a source region or a drain region), a semiconductor channel 14C, and a top active region 14T (which can be a drain region if the underlying bottom active region 14B is a source region, and a source region if the underlying bottom active region 14C is a drain region). As used herein, an "active region" refers to a source region or a drain region.

The vertical bit line access transistors can be formed by forming a semiconductor layer stack 14 including a first doped semiconductor layer for forming the bottom active regions 14B, a semiconductor channel material layer for forming the semiconductor channels 14C, and a second doped semiconductor layer for forming the top active regions 14T, which has a same type of doping as the first semiconductor layer. The semiconductor layer stack 14 can be patterned employing a combination of lithographic methods and an anisotropic etch such that each patterned portion of the semiconductor layer stack 14 is a rail structure that laterally extend along the first horizontal direction, and is laterally spaced apart among one another along the second horizontal direction by line trenches that extend along the first horizontal direction.

A spacer dielectric layer 40 can be formed at the bottom the line trenches by depositing a self-planarizing dielectric material (such as spin-on glass) or by filling the trenches with a dielectric material (such as organosilicate glass), planarizing the deposited dielectric material, and recessing the dielectric material selective to the rail structures including the materials of the semiconductor layer stack 14. Each spacer dielectric layer 40 can be formed over of the global vertical bit lines 10 and the separator dielectric material portions 12 such that the top surface of the spacer dielectric layer 40 is located at a target height for placing a bottom edge of gate electrodes 18 to be subsequently formed. For example, the top surface of the spacer dielectric layer 40 can be at a level about the interface between the remaining portions of the first conductivity type semiconductor layer and the channel material layer. In one embodiment, each spacer dielectric liner 40 can include a first dielectric liner 40A such as a silicon nitride liner and a second dielectric liner 40B such as a silicon oxide liner.

The gate dielectrics 16 and the gate electrodes 18 of the access transistors can be subsequently formed, for example, by depositing a conformal gate dielectric layer (e.g., silicon oxide) and a conformal electrically conductive layer (e.g., heavily or degenerately doped polysilicon) in the line trenches that separate the one-dimensional array of rail structures, and by anisotropically etching the conformal electrically conductive layer. The remaining vertical portions of the conformal electrically conductive layer constitute the gate electrodes 18, which extend along the first horizontal direction hd1. Each remaining portion of the conformal gate dielectric layer constitutes a gate dielectric 16. Each gate electrode 18 is laterally spaced from an adjacent rail structure by a vertical portion of a gate dielectric 16.

Remaining volumes of the line trenches are filled with at least one dielectric material. Excess portions of the at least one dielectric material can be removed from above the horizontal plane including the top surfaces of the rail structures (including the materials of the semiconductor layer stack 14) by a planarization process, which can employ, for example, chemical mechanical planarization. Each remaining portion of the deposited dielectric material in the trenches constitutes a dielectric rail structure 42, which is also referred to as an access transistor level dielectric rail. In one embodiment, each dielectric rail structure 42 can include a dielectric rail liner 42A and a dielectric rail fill material portion 42B. Each dielectric rail structure 42 extends along the first horizontal direction hd1.

The rail structures that include the materials of the semiconductor layer stack 14 can be patterned to form a two-dimensional array of pillar cavities that extend to the top surfaces of the separator dielectric material portions 12. For example, a photoresist layer can be applied over the rail structures that include the materials of the semiconductor layer stack 14 and the dielectric rail structures 42, and can be lithographically patterned to form openings in areas overlying the separator dielectric material portions 12. A one-dimensional array of line patterns can be employed, in which each line pattern laterally extends along the second horizontal direction. An anisotropic etch that removes semiconductor materials of the semiconductor layer stack 14 selective to the material of the access transistor dielectric rails 42 can be performed employing the patterned photoresist layer as an etch mask to form the two-dimensional array of pillar cavities. After removal of the photoresist layer, the pillar cavities can be filled with a dielectric material to form dielectric pillar spacers 27.

Each patterned portion of the semiconductor layer stack 14 can be a semiconductor pillar structure (14B, 14C, 14T) including a vertical stack of a bottom active region 14B, a semiconductor channel 14C, and a top active region 14T. The dielectric pillar spacers 27 are located between each neighboring pair of semiconductor pillar structures (14B, 14C, 14T) that are laterally spaced apart along the first horizontal direction hd1. Each alternating sequence of dielectric pillar spacers 27 and semiconductor pillar structures (14B, 14C, 14T) that extend along the first horizontal direction hd1 forms a composite rail structure (14B, 14C, 14T, 27). The composite rail structures (14B, 14C, 14T, 27) are laterally spaced from one another along the second horizontal direction hd2.

Optionally, top surfaces of the top active regions 14T may be optionally vertically recessed, and a sacrificial material can be deposited to temporarily protect the semiconductor pillar structures (14B, 14C, 14T) during subsequent processing steps. The sacrificial material can be planarized so that the top surfaces of the remaining sacrificial material portions are coplanar with the top surfaces of the dielectric rail structures 42. The sacrificial material portions are herein referred to as sacrificial cap structures 314. If the sacrificial cap structures 314 are present, each composite rail structure (14B, 14C, 14T, 27, 314) includes a row of sacrificial cap structures 314.

Each composite rail structure (14B, 14C, 14T, 27, 314) includes remaining portions of the semiconductor layer stack 14 and the dielectric pillar spacers 27 between a neighboring pair of dielectric rail structures 42. Each dielectric rail structure 42 can have a substantially vertical bottom portion, or can have a tapered bottom portion in which the width of the dielectric rail structure 42 monotonically or strictly increases as a function of a vertical distance from the substrate 8. In one embodiment, each dielectric rail structure 42 can include at least one dielectric material such as silicon nitride and/or silicon oxide. The dielectric rail structures 42 and the composite rail structures (14T, 14C, 14B, 27, 314) alternate along the second horizontal direction hd2.

The semiconductor pillar structures (14B, 14C, 14T), the gate dielectrics 16, and the gate electrodes 18 collectively form a two-dimensional array of vertical field effect transistors, which functions as access transistors for vertical bit lines to be subsequently formed thereabove. In an alternative embodiment to be described with respect to FIGS. 13A-13D below, the access transistors for vertical bit lines can be formed above the vertical bit lines after formation of the vertical bit lines to be described below.

Figure 2:
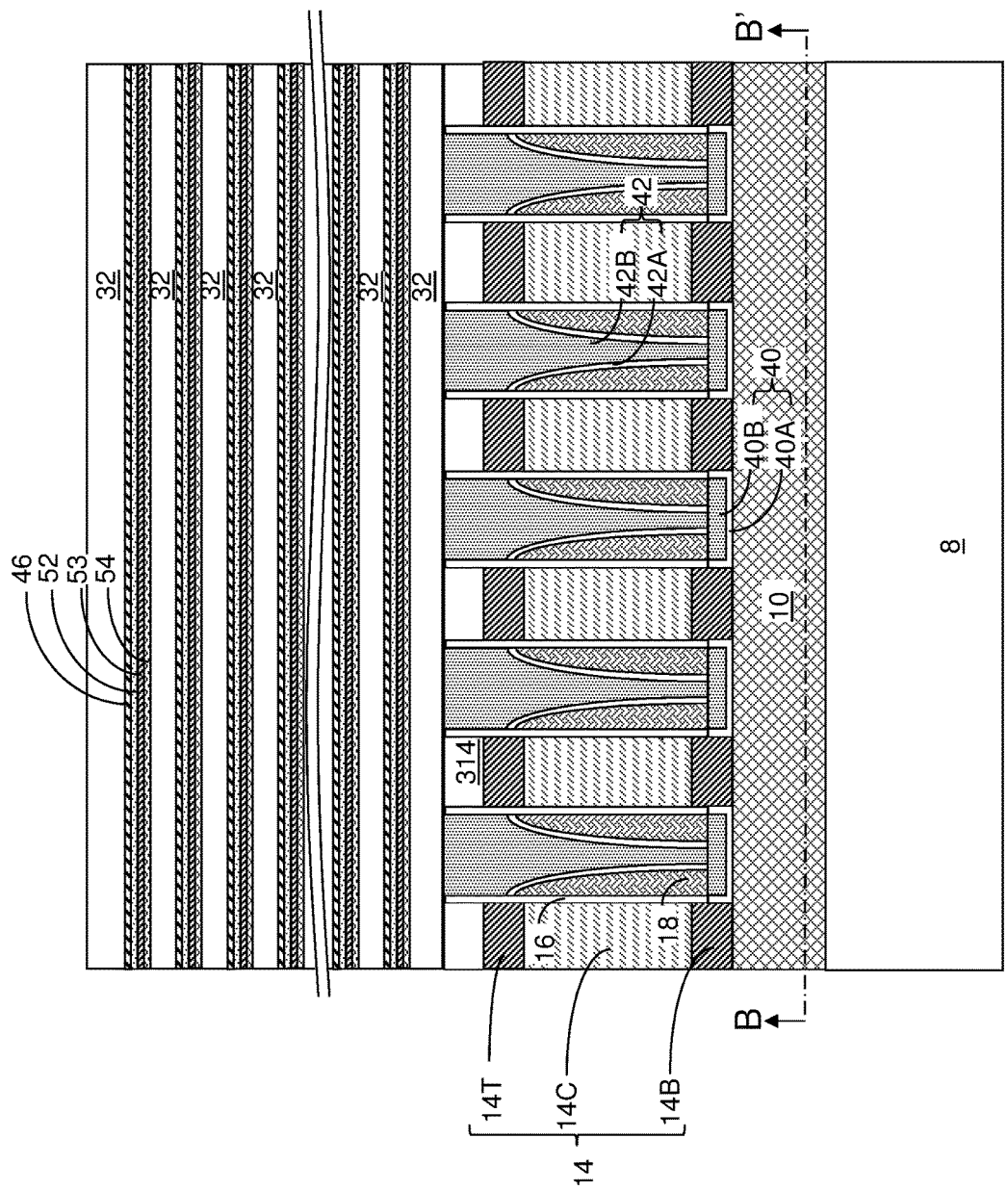
FIG. 2 is a vertical cross-sectional view of the first exemplary structure after formation of a vertically repeating sequence of unit layer stacks according to the first embodiment of the present disclosure.
Figure 3:
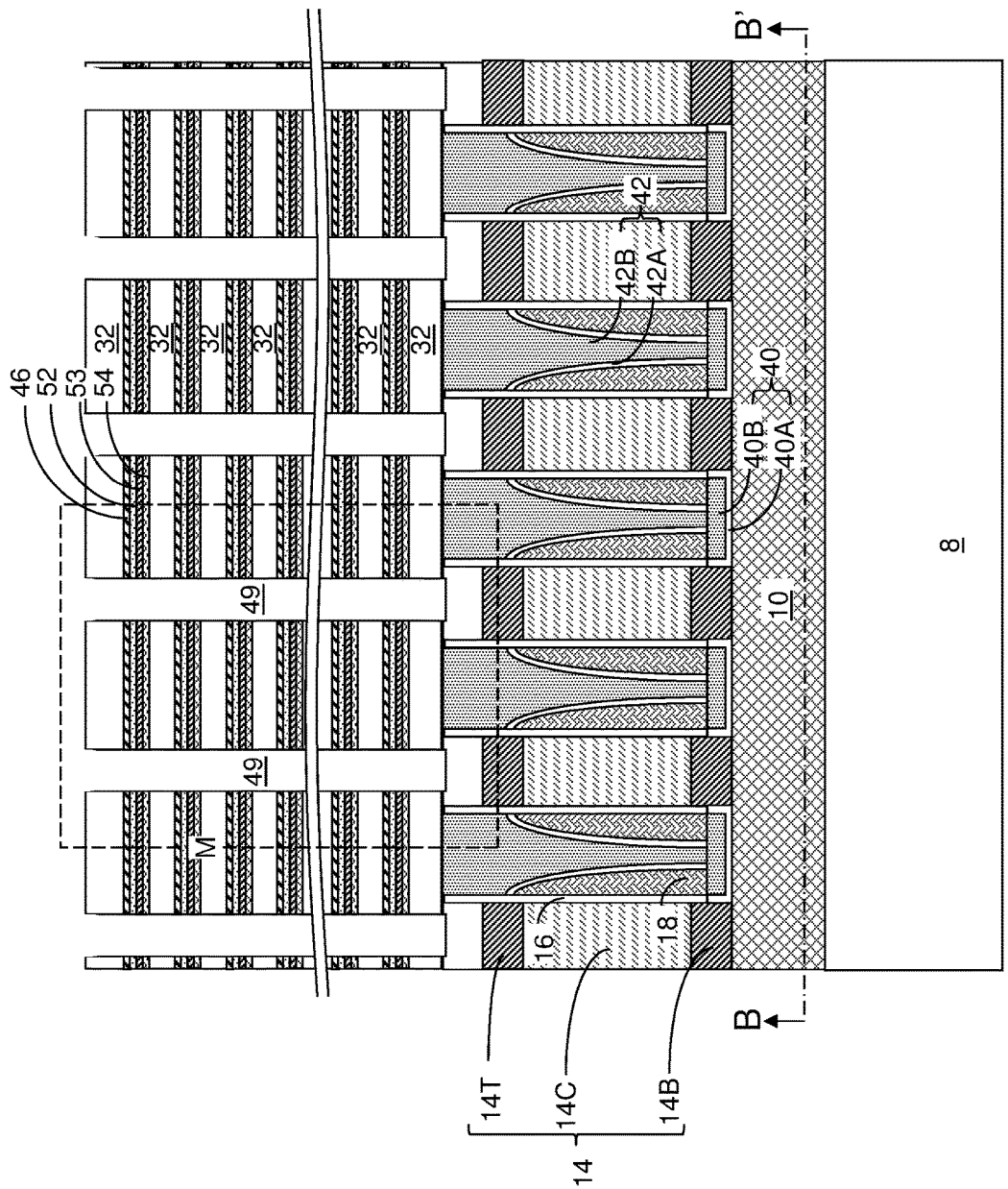
FIG. 3 is a vertical cross-sectional view of the first exemplary structure after formation of line trenches through the vertically repeating sequence according to the first embodiment of the present disclosure.
Figure 4C:
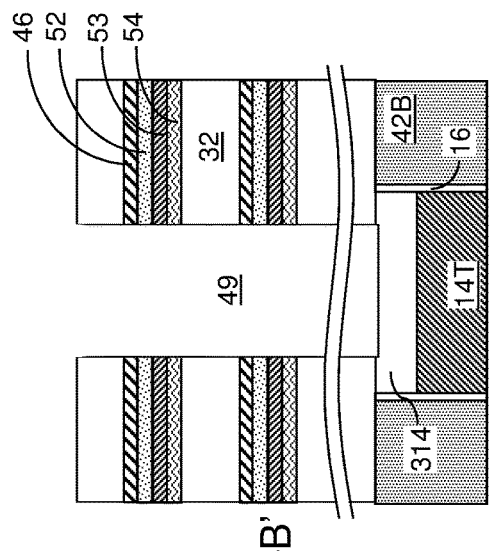
FIG. 4C is a vertical cross-sectional view along the vertical plane C-C' of FIG. 4A.
Figure 4D:
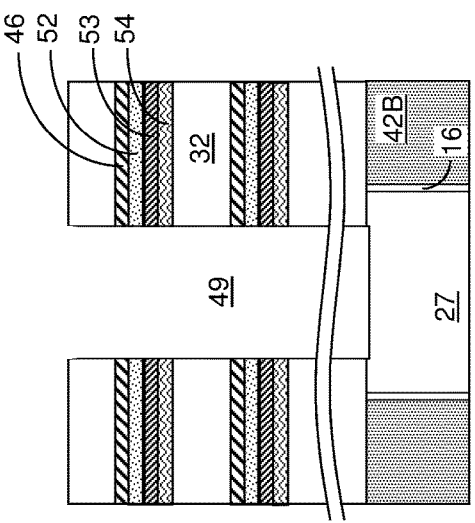
FIG. 4D is a vertical cross-sectional view along the vertical plane D-D' of FIG. 4A.
Figure 4A:
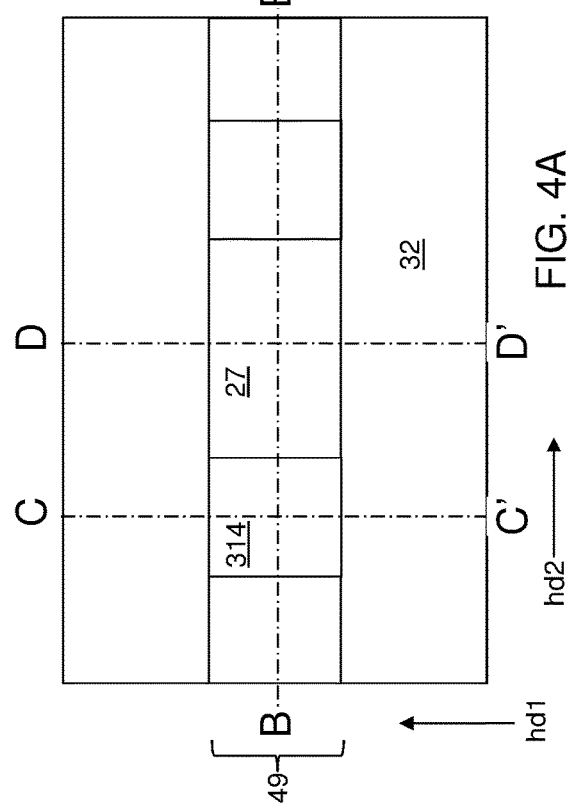
FIG. 4A is a top-down view of region M of the first exemplary structure of FIG. 3.
Figure 4B:
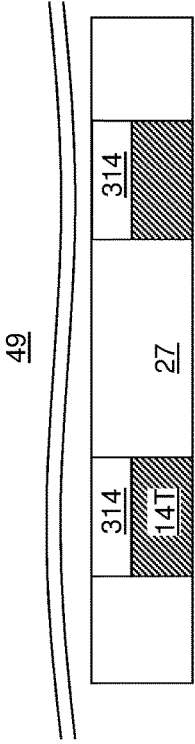
FIG. 4B is a vertical cross-sectional view along the vertical plane B-B' of FIG. 4A.
Figure 12A:
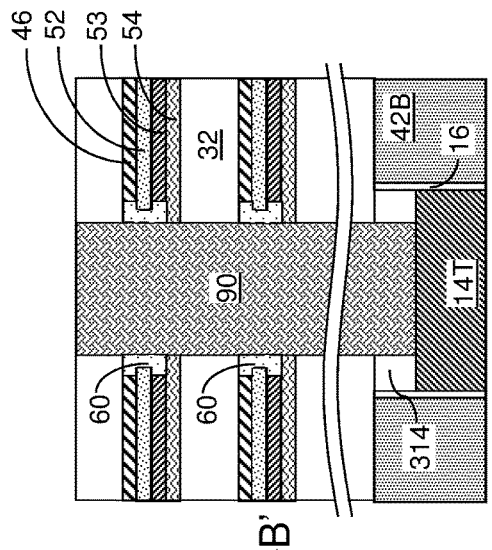
FIG. 12A is a top-down view of the second alternative embodiment of the first exemplary structure after formation of vertical bit lines according to the first embodiment of the present disclosure.
Figure 12C:
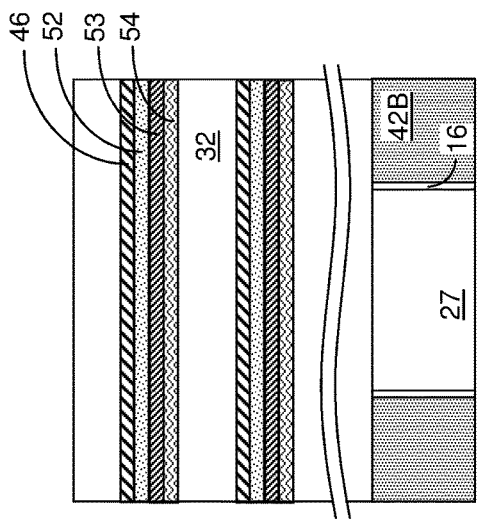
FIG. 12C is a vertical cross-sectional view along the vertical plane C-C' of FIG. 12A.
Figure 12B:
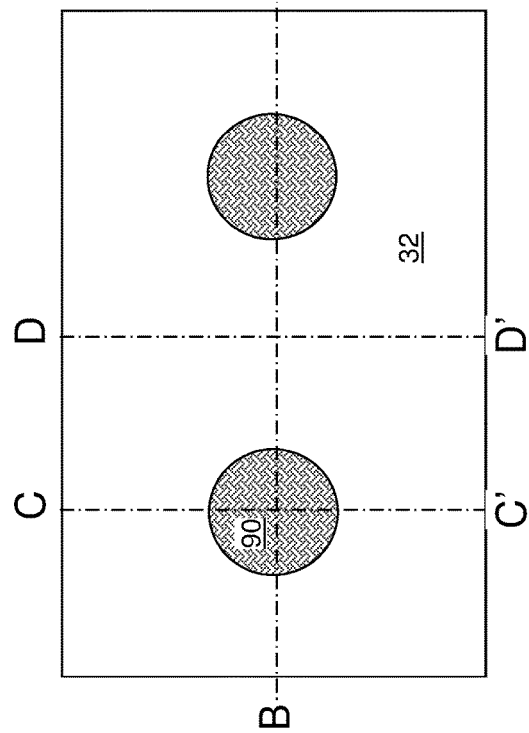
FIG. 12B is a vertical cross-sectional view along the vertical plane B-B' of FIG. 12A.
Figure 12D:
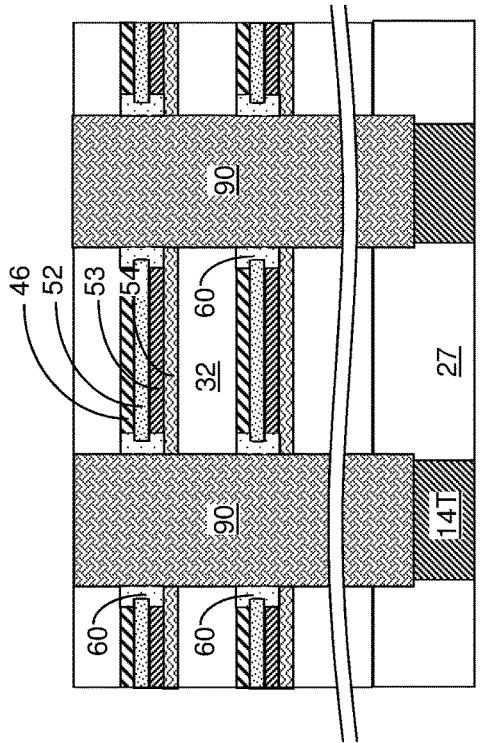
FIG. 12D is a vertical cross-sectional view along the vertical plane D-D' of FIG. 12A.

Referring to FIG. 2, a vertically repeating sequence of unit layer stacks (32, 54, 53, 52, 46) is formed over the two-dimensional array of vertical field effect transistor. Each of the unit layer stacks (32, 54, 53, 52, 46) includes at least an insulating layer 32, a phase change memory material layer 52, and an electrically conductive layer 46.

The insulating layers 32 include an insulating material. Insulating materials that can be employed for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the material of the insulating layers 32 can be silicon oxide or silicon nitride. The thickness of each insulating layer 32 can be in a range from 6 nm to 100 nm, such as from 12 nm to 50 nm, although lesser and greater thicknesses can also be employed.

The electrically conductive layers 46 include an electrically conductive material. Electrically conductive materials that can be employed for the electrically conductive layers 46 include, but are not limited to, an elemental metal (e.g., aluminum, tungsten, copper, titanium, tantalum, etc.), an intermetallic alloy of at least two elemental metals, a conductive alloy of at least one metal and at least one non-metallic element (such as a conductive metal nitride, e.g., TiN, or a metal silicide), and a conductive doped semiconductor material (e.g., doped polysilicon). The thickness of each electrically conducive layer 46 can be in a range from 6 nm to 100 nm, such as from 12 nm to 50 nm, although lesser and greater thicknesses can also be employed.

The phase change memory material layers 52 include the phase change material (PCM), which is also referred to herein as a "phase change memory material" herein when used as the memory or phase switching material of the memory device. As used herein, a "phase change memory material" refers to a material having at least two different phases providing different resistivity. The at least two different phases can be provided, for example, by controlling the rate of cooling from a heated state to provide an amorphous state having a higher resistivity and a polycrystalline state having a lower resistivity. In this case, the higher resistivity state of the phase change memory material can be achieved by faster quenching of the phase change memory material after heating to an amorphous state, and the lower resistivity state of the phase change memory material can be achieved by slower cooling of the phase change memory material after heating to the amorphous state.

Exemplary phase change memory materials include, but are not limited to, germanium antimony telluride compounds, such as $Ge_2Sb_2Te_5$ (GST), germanium antimony compounds, indium germanium telluride compounds, silicon telluride compounds, aluminum selenium telluride compounds, indium selenium telluride compounds, and aluminum indium selenium telluride compounds. These compounds (e.g., compound semiconductor material) may be doped (e.g., nitrogen doped GST) or undoped. Thus, the phase change memory material layer 52 can include, and/or can consist essentially of, a material selected from a germanium antimony telluride compound, a germanium antimony compound, an indium germanium telluride compound, an aluminum selenium telluride compound, an indium selenium telluride compound, or an aluminum indium selenium telluride compound. The phase change memory material layer 52 within a unit layer stack (32, 54, 53, 52, 46) can directly contact the electrically conductive layer 46 within the unit layer stack (32, 54, 53, 52, 46). The phase change memory material layer 52 within each unit layer stack (32, 54, 53, 52, 46) may be located above, or below, the electrically conductive layer 46 within the unit layer stack (32, 54, 53, 52, 46). The thickness of each phase change memory material layer 52 can be in a range from 1 nm to 40 nm, such as from 2 nm to 20 nm, although lesser and greater thicknesses can also be employed.

Each of the unit layer stacks (32, 54, 53, 52, 46) can include an ovonic threshold switch material layer 54 that includes an ovonic threshold switch material. As used herein, an "ovonic threshold switch material" refers to a material that displays a non-linear resistivity curve under an applied external bias voltage such that the resistivity of the material decreases with the magnitude of the applied external bias voltage. In other words, an ovonic threshold switch material is non-Ohmic, and becomes more conductive under a higher external bias voltage than under a lower external bias voltage. An ovonic threshold switch material can be non-crystalline (for example, by being amorphous) at a non-conductive state, and can remain non-crystalline (for example, by remaining amorphous) at a conductive state, and can revert back to a high resistance state when a high voltage bias thereacross is removed, i.e., when not subjected to a large voltage bias across a layer of the ovonic threshold voltage material. Throughout the resistive state changes, the ovonic threshold switch material can remain amorphous. In one embodiment, the ovonic threshold switch material can comprise a chalcogenide material which exhibits hysteresis in both the write and read states. The chalcogenide material may be a GeTe compound or a Ge—Se compound doped with a dopant selected from As, N, and C, such as a Ge—Se—As compound semiconductor material. The ovonic threshold switch material layer 54 can include any ovonic threshold switch material. In one embodiment, the ovonic threshold switch material layer 54 can include, and/or can consist essentially of, a GeSeAs alloy, a GeSe alloy, an SeAs alloy, a GeTe alloy, or an SiTe alloy.

In one embodiment, the material of the ovonic threshold switch material layer 54 can be selected such that the resistivity of the ovonic threshold switch material layer 54 decreases at least by two orders of magnitude (i.e., by more than a factor of 100) upon application of an external bias voltage that exceeds a critical bias voltage magnitude. In one embodiment, the composition and the thickness of the ovonic threshold switch material layer 54 can be selected such that the critical bias voltage magnitude can be in a range from 1 V to 4 V, although lesser and greater voltages can also be employed for the critical bias voltage magnitude. The thickness of the ovonic threshold switch material layer 54 can be, for example, in a range from 1 nm to 40 nm, such as from 2 nm to 20 nm, although lesser and greater thicknesses can also be employed. The ovonic threshold switch material layer 54 within a unit layer stack (32, 54, 53, 52, 46) can be spaced from the electrically conductive layer 46 within the unit layer stack (32, 54, 53, 52, 46) at least by the phase change memory material layer 52 within a unit layer stack (32, 54, 53, 52, 46). The ovonic threshold switch material layer 54 can contact the insulating layer 32 within the unit layer stack (32, 54, 53, 52, 46), or can contact an insulating layer within an overlying or underlying insulating layer 32.

Each of the unit layer stacks (32, 54, 53, 52, 46) can optionally include a diffusion barrier material layer 53. The diffusion barrier material layer 53 can be located between an ovonic threshold switch material layer 54 and a phase change memory material layer 52 within each unit layer stack (32, 54, 53, 52, 46). The diffusion barrier material layer 53 suppresses interdiffusion between the material of the ovonic threshold switch material layer 54 and the phase change memory material layer 52 within each unit layer stack (32, 54, 53, 52, 46). The diffusion barrier material layer 53 can include a conductive metallic nitride material (e.g., TiN), a conductive metal (e.g., Ta and/or Ti) or a conductive carbon-containing material such as a thin layer of amorphous carbon or polycrystalline carbon. The thickness of each diffusion barrier material layer 53 can be in a range from 0.5 nm to 10 nm, such as from 1 nm to 5 nm, although lesser and greater thicknesses can also be employed.

The total number of repetitions of the unit layer stacks (32, 54, 53, 52, 46) within the vertically repeating sequence of unit layer stacks (32, 54, 53, 52, 46) can be in a range from 4 to 1,024, such as from 8 to 256, although lesser and greater number of repetitions can also be employed. An insulating layer 32 can be provided at the top of the vertically repeating sequence of unit layer stacks (32, 54, 53, 52, 46) as a capping layer.

Referring to FIGS. 3 and 4A-4D, openings are formed through the vertically repeating sequence of unit layer stacks (32, 54, 53, 52, 46), for example, by applying and patterning a photoresist layer (not shown) thereabove, and by transferring the pattern in the photoresist layer through the vertically repeating sequence of unit layer stacks (32, 54, 53, 52, 46) by an anisotropic etch. A plurality of openings vertically extending through the vertically repeating sequence of unit layer stacks (32, 54, 53, 52, 46) is formed.

In one embodiment, the plurality of openings through the vertically repeating sequence of unit layer stacks (32, 54, 53, 52, 46) can include line trenches 49 that laterally extend along the first horizontal direction hd1 or along the second horizontal direction hd2. The areas of line trenches 49 form stripes that cover the areas of the rows of the underlying semiconductor pillar structures (14B, 14C, 14T) or the areas of columns of the underlying semiconductor pillar structures (14B, 14C, 14T). The line trenches 49 can laterally extend along a horizontal direction. The line trenches 49 divide the vertically repeating sequence of unit layer stacks (32, 54, 53, 52, 46) as provided at the processing steps of FIG. 2 into a plurality of vertically repeating sequences of unit layer stacks (32, 54, 53, 52, 46) that are laterally spaced apart by the line trenches 49.

While an embodiment in which the line trenches 49 extend along the second horizontal direction hd2 is illustrated in FIGS. 4A-4D, an embodiment in which the line trenches 49 extend along the second horizontal direction hd1 is expressly contemplated herein. The width of each line trench 49 can be in a range from 20 nm to 200 nm, although lesser and greater widths can also be employed. The plurality of line trenches 49 can be formed as a one-dimensional periodic array having a uniform pitch along the widthwise direction of the line trenches 49.

Referring to FIGS. 5A-5D, insulating spacers 60 can be formed to cover surfaces of the electrically conductive layers 46, the phase change memory material layers 52, and the diffusion barrier material layers 53 around each of the line trenches 49. In one embodiment, the insulating spacers 60 can be formed by selectively anodizing surface portions of the electrically conductive layers 46, the phase change memory material layers 52, and the optional diffusion barrier material layers 53 around each of the plurality of line trenches 49 without anodizing the ovonic threshold switch material layers 54. In this case, the electrical bias voltages applied to the electrically conductive layers 46, the phase change memory material layers 52, the optional diffusion barrier material layers 53, and the ovonic threshold switch material layers 54 can be less than a threshold voltage that renders conductive the material of the ovonic threshold switch material layers 54. Thus, only the surface portions of the electrically conductive layers 46, the phase change memory material layers 52, and the optional diffusion barrier material layers 53 are anodized, while surface portions of the ovonic threshold switch material layers 54 are not anodized because they are not electrically conductive. The electrically conductive layers 46 can be attached to a temporary common electrode during the anodization. The substrate is placed into an electrolytic solution and a current or voltage is applied to the temporary common electrode. The current flows through the electrically conductive and/or semiconductor materials of the electrically conductive layers 46 (which in this embodiment comprise anodizable materials such as Al, Ta, Ti, etc.), the phase change memory material layers 52, and the optional diffusion barrier material layers 53 (which in this embodiment comprise anodizable materials, such as TiN, Ta, Ti, etc.) to anodize their edge portions exposed in the line trenches 49 which are filled with the electrolytic solution.

Each continuous anodized portion of the electrically conductive layers 46, the phase change memory material layers 52, and the optional diffusion barrier material layers 53 forms an insulating spacer 60. Thus, a vertical stack of insulating spacers 60 is formed on each side of each line trench 49. Vertical stacks of insulating spacers 60 are formed around the plurality of line trenches 49 at levels of the electrically conductive layers 46, the phase change memory material layers 52, and the optional diffusion barrier material layers 53. Each insulating spacer 60 can include a first portion 6A including a first dielectric oxide material (e.g., metal oxide, such as an oxide of Al, Ti, Ta, etc.) formed by anodization of a surface portion of an electrically conductive layer 46, a second portion 6B including a second dielectric oxide material (e.g., semiconductor oxide, such as an oxide of Ge, Sb and/or Te) formed by anodization of a surface portion of a phase change memory material layer 52, and an optional third portion 6C including a third dielectric oxide material (e.g., metal oxide, such as an oxide of barrier metal such as Ti, Ta, etc.) formed by anodization of a surface portion of an optional diffusion barrier material layer 53.

Each of the insulating spacers 60 contacts sidewalls of a respective one of the electrically conductive layers 46 and a respective one of the phase change memory material layers 52, and optionally, a respective one of the conducive diffusion barrier material layers 53, if present. In one embodiment, each of the insulating spacers 60 can contact a horizontal surface of a respective one of the insulating layers 32. In one embodiment, each of the insulating spacers 60 can comprise an insulating rail structure that laterally extends along a horizontal direction (e.g., hd2). As used herein, a "rail" or a "rail structure" refers to a structure that extends along a lengthwise direction.

In one embodiment, the materials of the electrically conductive layers 46, the phase change memory material layers 52, and the optional diffusion barrier material layers 53 can have different anodization rates. In this case, the thickness of the first portion 6A, the second portion 6B, and the third portion 6C of each insulating spacer 60 can be different among one another, and a sidewall of each insulating spacer 60 that contacts the electrically conductive layers 46, the phase change memory material layers 52, and the optional diffusion barrier material layers 53 can have a laterally undulating profile. The ovonic threshold switch material layer 54 is not anodized during the anodization process. Thus, a horizontal surface of each insulating spacer 60 can contact a horizontal surface of a respective one of the ovonic threshold switch material layers 54. The un-anodized edge of each ovonic threshold switch material layer 54 is exposed in the line trenches 49. The lateral thickness of each insulating spacer 60 can be in a range from 1 nm to 20 nm, such as from 2 nm to 10 nm, and may vary depending on the location of measurement, i.e., depending on the level at which the lateral thickness is measured.

Referring to FIGS. 6A-6D, an anisotropic etch process can be performed to vertically extend the line trenches 49 (e.g., through the sacrificial cap structures 314). Top surfaces of the top active regions 14T of the underlying two-dimensional array of vertical field effect transistors can be physically exposed at the bottom of the line trenches 49. Physically exposed sidewalls of the insulating spacers 60 can be vertically coincident with sidewalls of the ovonic threshold switch material layer 54, and may be vertically coincident with the sidewalls of the insulating layers 32.

Referring to FIGS. 7A-7D, a conductive material can be deposited in line trenches 49 by a conformal deposition process. The conductive material can include a doped semiconductor material (such as polysilicon) and/or a metallic material (such as an elemental metal, an intermetallic alloy, or a conductive metallic compound such as a metal silicide or a metal nitride). For example, the conductive material can be titanium nitride and/or tungsten. The deposited conductive material forms a conductive material layer, which fills the volumes of the line trenches 49 and contacts sidewalls of the insulating layers 32, the insulating spacers 60, and the ovonic threshold switch material layers 54.

A planarization process can be performed to remove portions of the conductive material layer from above the top surfaces of the topmost insulating layers 32. The planarization process can be performed by chemical mechanical planarization and/or a recess etch. The conductive material layer is divided into multiple discrete portions that are located entirely within a respective one of the line trenches 49. Each discrete remaining portion of the conductive material layer constitutes an electrically conductive rail 90' that extends along a lengthwise direction with a uniform vertical cross-sectional shape in vertical planes that are perpendicular to the lengthwise direction. In one embodiment, the electrically conductive rails 90' can have a respective rectangular vertical cross-sectional shape along vertical planes that are perpendicular to the lengthwise direction.

Referring to FIGS. 8A-8D, a photoresist layer (not shown) is applied over the vertically repeating sequences of unit layer stacks (32, 54, 53, 52, 46) and the electrically conductive rails 90', and is lithographically patterned to form a two-dimensional array of rectangular openings that overlap with areas of the electrically conductive rails 90'. The pattern in the photoresist layer can be transferred through portions of the electrically conductive rails 90' that are not covered by the patterned photoresist layer by performing an anisotropic etch process. The anisotropic etch process removes the material of the electrically conductive rails 90' within areas that are not masked by the photoresist layer. For example, if the electrically conductive rails 90' include doped polysilicon and if the insulating layers 32 include silicon oxide, the chemistry of the anisotropic etch process can be selected to etch polysilicon selective to silicon oxide.

In one embodiment, the pattern of the openings in the photoresist layer can be selected such that the patterned photoresist layer covers each portion of the electrically conductive rails 90' that overlies the top active regions 14T. The anisotropic etch process can form a two-dimensional array of pillar cavities, which divides the electrically conductive rails 90' into a two-dimensional array of conductive pillar structures. Each conductive pillar structure is herein referred to as a vertical bit line 90. Each vertical bit line 90 can contact only one of the top active regions 14T of the underlying two-dimensional array of vertical field effect transistors. The photoresist layer can be subsequently removed, for example, by ashing.

The two-dimensional array of vertical bit lines 90 can be arranged as a periodic two-dimensional array having the same periodicity in two horizontal directions as the underlying two-dimensional array of semiconductor pillar structures 14. In this case, the two-dimensional array of pillar cavities can have the same periodicity as the two-dimensional array of vertical bit lines 90.

A dielectric material layer can be deposited into the two-dimensional array pillar cavities to form a two-dimensional array of dielectric pillar structures 260. In this case, the dielectric pillar structures 260 laterally separate the vertical bit lines 90 along the lengthwise direction (e.g., hd2) of the line trenches 49. In other words, the dielectric pillar structures 260 are formed between each neighboring pair of vertical bit lines 90 among the plurality of vertical bit lines 90 that are laterally spaced along the horizontal direction (e.g., hd2) along which the line cavities 49 extend. Each vertical bit line 90 is located within an opening defined by a neighboring pair of vertically repeating sequence of unit layer stacks (32, 54, 53, 52, 46) and a neighboring pair of dielectric pillar structures 260. Each of the insulating spacers 60 contacts a sidewall of a respective one of the plurality of vertical bit lines 90. Each vertical bit line 90 contacts the exposed edges of the ovonic threshold switch material layers 54, but does not contact the phase change memory material layers 52 whose proximal edges are covered by the insulating spacers 60.

The electrically conductive layers 46 function as word lines, and the vertical bit lines 90 accessed through a respective underlying vertical field effect transistor function as vertical bit lines. Upon selection of a word line and a vertical bit line through application of a respective selection voltage to a corresponding electrically conductive layer 46 and a corresponding vertical bit line 90, an electrical current path is defined that includes an ovonic threshold switch material layer 54, a diffusion barrier material layer 53, and a phase change memory material layer 52 between the selected word line and the selected vertical bit line. The current between the word lines 46 and the vertical bit lines 90 passes through the both the ovonic threshold switch material layers 54 (which contacts the vertical bit lines 90 but not the word lines 46) and the phase change memory material layer 52 (which contacts the word lines 46 but not the vertical bit lines 90). By applying a voltage bias that is high enough to turn on the ovonic threshold switch material layer 54 (i.e., to cause the state of the ovonic threshold switch material layer 54 to change into a low resistance state), the selected phase change memory material layer 52 can be heated. Programming of the state of the selected phase change memory material layer 52 can be effected through control of the waveform of the electrical pulse applied after heating the selected phase change memory material layer 52.

Referring to FIGS. 9A-9D, a first alternative embodiment of the first exemplary structure according to the first embodiment of the present disclosure is illustrated, which can be derived from the first exemplary structure of FIGS. 3 and 4A-4D by selectively etching the materials of the electrically conductive layers 46, the phase change memory material layers 52, and the diffusion barrier material layers 53 selective to the material of the ovonic threshold switch material layers 54. A plurality of isotropic etch processes may be employed to sequentially etch each type of layers among the electrically conductive layers 46, the phase change memory material layers 52, and the diffusion barrier material layers 53 selective to the ovonic threshold switch material layers 54. Each isotropic etch process employed to etch the materials of the electrically conductive layers 46, the phase change memory material layers 52, and the diffusion barrier material layers 53 may, or may not, be selective to the material of the insulating layers 32. In one embodiment, the at least one isotropic etch process employed to etch the materials of the electrically conductive layers 46, the phase change memory material layers 52, and the diffusion barrier material layers 53 may be selective to the material of the insulating layers 32.

A lateral recess 59 is formed in each continuous volume from which the materials of the electrically conductive layers 46, the phase change memory material layers 52, and the diffusion barrier material layers 53 are laterally recessed. Because of the different material compositions among the materials of the electrically conductive layers 46, the phase change memory material layers 52, and the diffusion barrier material layers 53, the lateral recess distances may be different for each of the materials of the electrically conductive layers 46, the phase change memory material layers 52, and the diffusion barrier material layers 53 for each lateral recess 59. Each lateral recess 59 can laterally extend along the same direction as the lengthwise direction of the line trenches 49. The lateral recess distance of each lateral recess 59 can be in a range from 1 nm to 20 nm, such as from 2 nm to 10 nm, and may vary depending on the location of measurement, i.e., depending on the level at which the lateral thickness is measured.

Referring to FIGS. 10A-10D, a conformal insulating material layer can be deposited in the lateral recesses 59 and on the surfaces of the line trenches 49 and above the top surfaces of the topmost insulating layers 32. The conformal insulating material layer includes a dielectric material such as silicon oxide, a dielectric metal oxide, or silicon nitride. The thickness of the conformal insulating material layer can be greater than the maximum lateral extent of the lateral recesses 59. An anisotropic etch process can be performed to remove portions of the conformal insulating material layer that are located outside the volumes of the lateral recesses 59. Remaining portions of the conformal insulating material layer fill each of the lateral recesses 59, and constitute insulating spacers 60. Each of the insulating spacers 60 can have a homogeneous composition throughout. Two vertical stacks of insulating spacers 60 are formed around each line trench 49. The lateral recesses 59 are filled with vertical stacks of insulating spacers 60. Physically exposed sidewalls of the insulating spacers 60 can be vertically coincident with sidewalls of the ovonic threshold switch material layer 54, and may be vertically coincident with the sidewalls of the insulating layers 32.

Subsequently, the processing steps of FIGS. 6A-6D, 7A-7D, and 8A-8D can be performed to form a two-dimensional array of vertical bit lines 60. The resulting structure can be the same as the exemplary structure of FIGS. 8A-8D except that the insulating spacers 60 can have a homogeneous composition instead of having multiple portions (6A, 6B, 6C) having different compositions.

Referring to FIGS. 11A-11D, a second alternative embodiment of the first exemplary structure according to the first embodiment of the present disclosure is illustrated, which is derived from the first exemplary structure of FIG. 2 by forming discrete openings 149 through the vertically repeating sequence of unit layer stacks (32, 54, 53, 52, 46) instead of forming line trenches 49 illustrated in FIGS. 3 and 4A-4D. The horizontal cross-sectional shape of each discrete opening 149 may be circular, oval, polygonal, or of any generally curvilinear closed shape.

The discrete openings 149 can be formed as a two-dimensional array having the same periodicity as the underlying two-dimensional array of vertical field effect transistors. In one embodiment, the areas of the discrete openings 149 can overlap the areas of the top active regions 14T. The discrete openings 149 can be formed, for example, by applying and patterning a photoresist layer over the topmost insulating layer 32 to form openings therein, and by transferring the pattern of the openings in the photoresist layers through the vertically repeating sequence of unit layer stacks (32, 54, 53, 52, 46) by an anisotropic etch. In one embodiment, the bottom surfaces of the discrete openings 149 can be formed on the sacrificial cap structures 314.

Referring to FIGS. 12A-12D, the processing steps of FIGS. 5A-5D or the processing steps of FIGS. 9A-9D and 10A-10D can be performed to form insulating spacers 60. Thus, the insulating spacers 60 can be formed by anodization of surface portions of the electrically conductive layers 46, the phase change memory material layers 52, and the optional diffusion barrier material layer 53, or by recessing portions of electrically conductive layers 46, the phase change memory material layers 52, and the optional diffusion barrier material layer 53 and depositing and anisotropically etching an insulating material layer. The insulating spacers 60 can have annular shaped, i.e., can have an opening therethrough and thus, can be topologically homeomorphic to a torus.

Subsequently, the processing steps of FIGS. 6A-6D can be performed to vertically extend the discrete openings 149, and to physically expose top surfaces of the top active regions 14T. The inner sidewalls of the insulating spacers 60 can be vertically coincident with sidewalls of the ovonic threshold switch material layer 54, and may be vertically coincident with the sidewalls of the insulating layers 32.

The processing steps of FIGS. 7A-7D can be subsequently performed to form vertical bit lines 90 within the discrete openings 149. The electrically conductive layers 46 function as word lines, and the vertical bit lines 60 accessed through a respective underlying vertical field effect transistor function as vertical bit lines. Each layer within the vertically repeating sequence of unit layer stacks (32, 54, 53, 52, 46) can include as many openings therethrough as the total number of vertical bit lines 90.

Referring to FIGS. 13A-13D, a third alternative embodiment of the first exemplary structure according to the first embodiment of the present disclosure is illustrated, which can be derived from any of the first exemplary structure or alternative embodiments described above. In this case, an insulating substrate 108, which may consist of an insulating substrate material or may include a topmost insulating layer and additional material layers (such as a semiconductor substrate with semiconductor devices thereupon and metal interconnect structures thereabove) can be employed in lieu of a two-dimensional array of vertical field effect transistors (14, 16, 18) located below the vertical bit lines 90 described above. Electrical contact to the vertical bit lines 90 can be provided from above, for example, by depositing a contact level dielectric layer 92 and contact via structures 96 extending through the contact level dielectric layer 92 and contacting a top surface of a respective one of the vertical bit lines 90. In this embodiment, the vertical field effect transistors (14, 16, 18) electrically contact the contact via structures 96 and are located below the vertical bit lines 90

Figure 14:
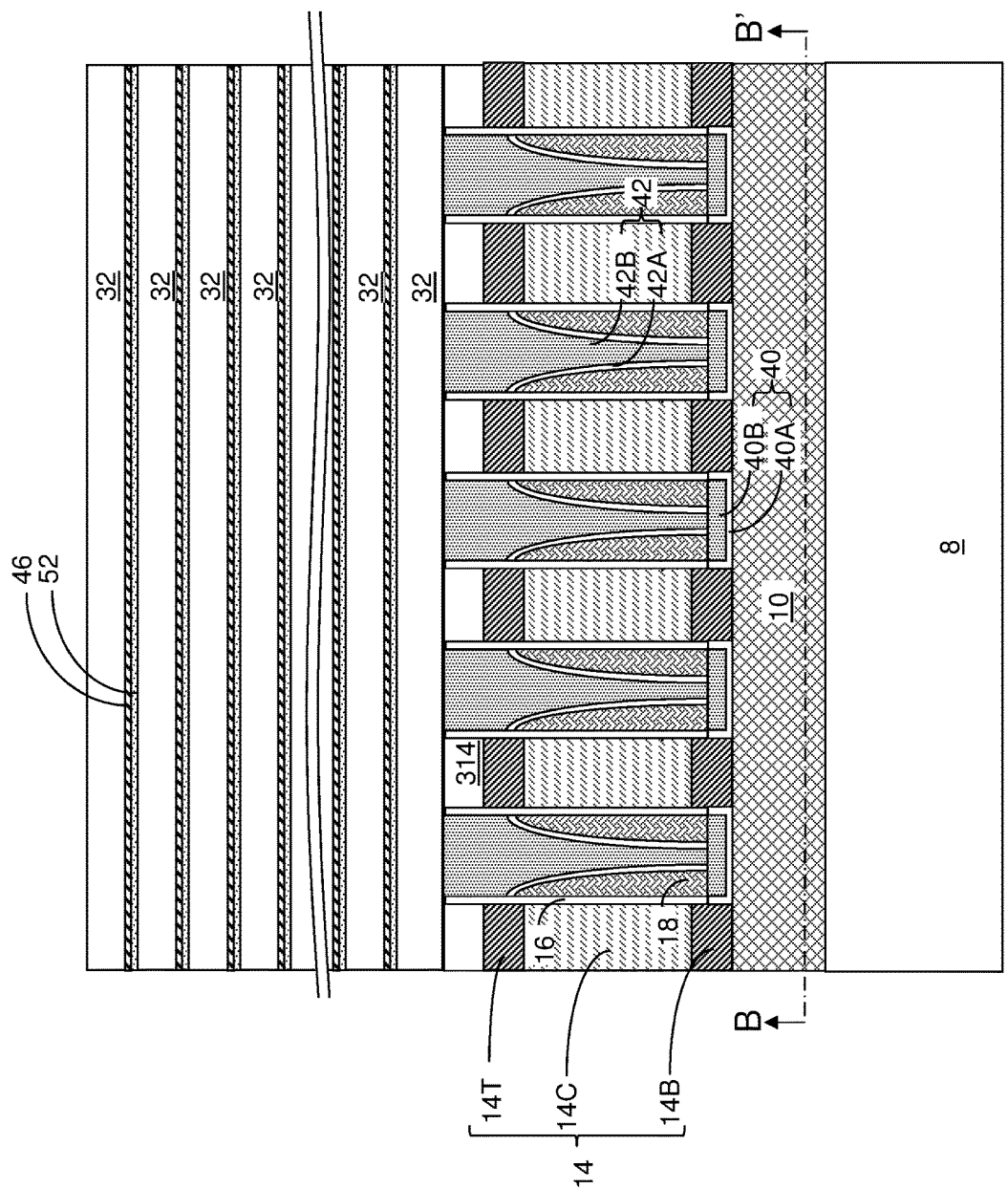
FIG. 14 is a vertical cross-sectional view of a second exemplary structure after formation of a vertically repeating sequence of unit layer stacks according to a second embodiment of the present disclosure.
Figure 15:
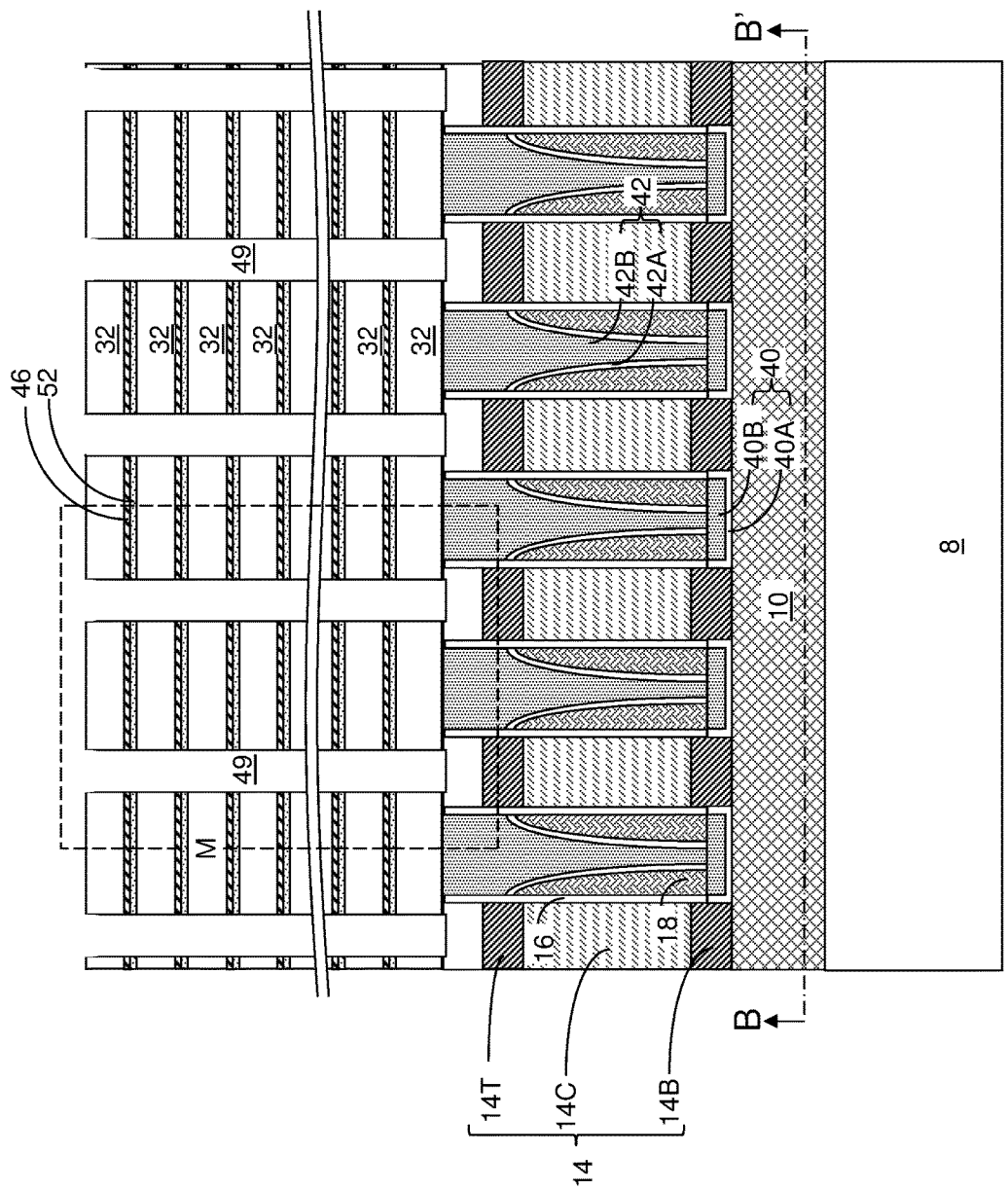
FIG. 15 is a vertical cross-sectional view of the second exemplary structure after formation of line trenches through the vertically repeating sequence according to the second embodiment of the present disclosure.
Figure 22A:
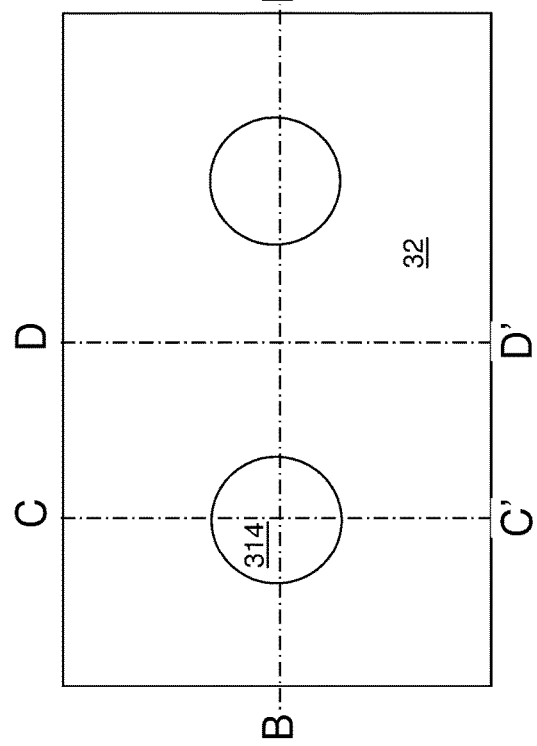
FIG. 22A is a top-down view of a first alternative embodiment of the second exemplary structure after formation of discrete openings through the vertically repeating sequence of unit layer stacks according to the second embodiment of the present disclosure.
Figure 22C:
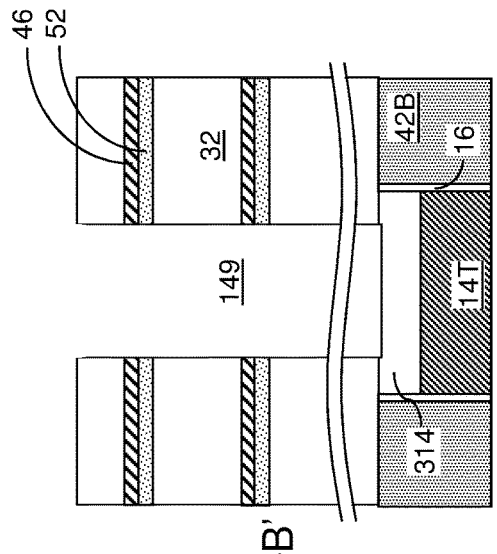
FIG. 22C is a vertical cross-sectional view along the vertical plane C-C' of FIG. 22A.
Figure 22B:
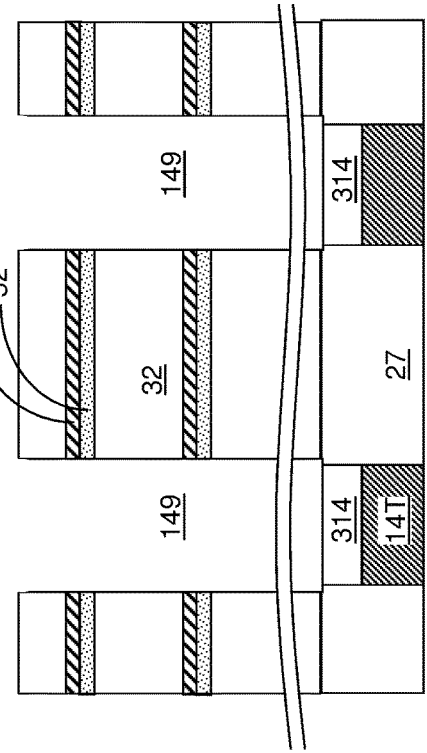
FIG. 22B is a vertical cross-sectional view along the vertical plane B-B' of FIG. 22A.
Figure 22D:
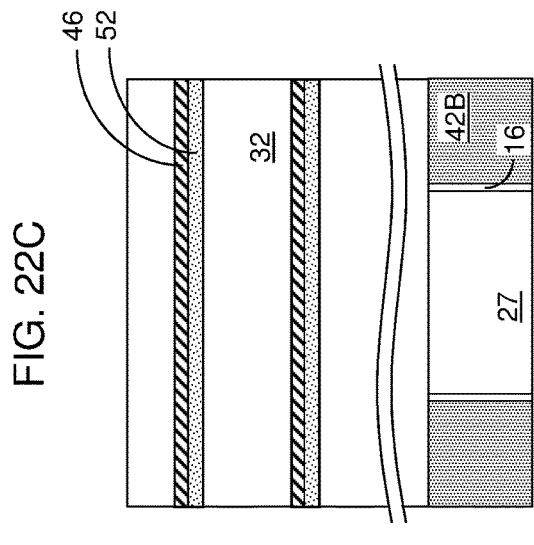
FIG. 22D is a vertical cross-sectional view along the vertical plane D-D' of FIG. 22A.
Figure 24A:
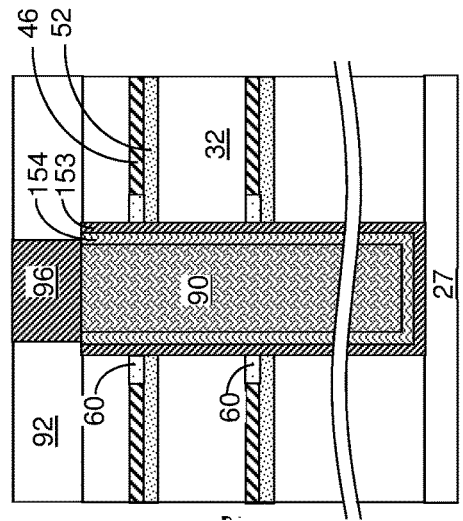
FIG. 24A is a top-down view of a second alternative embodiment of the second exemplary structure according to the second embodiment of the present disclosure.
Figure 24C:
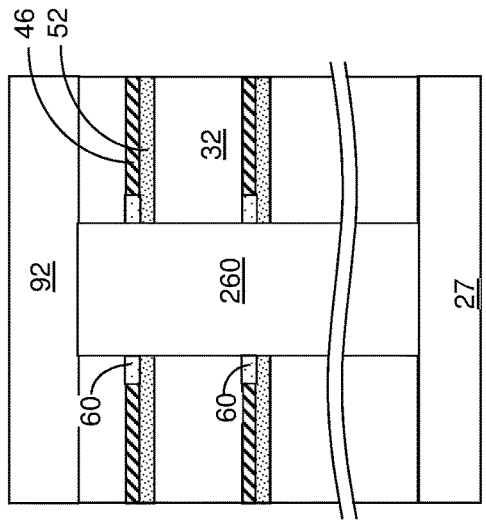
FIG. 24C is a vertical cross-sectional view along the vertical plane C-C' of FIG. 24A.
Figure 24B:
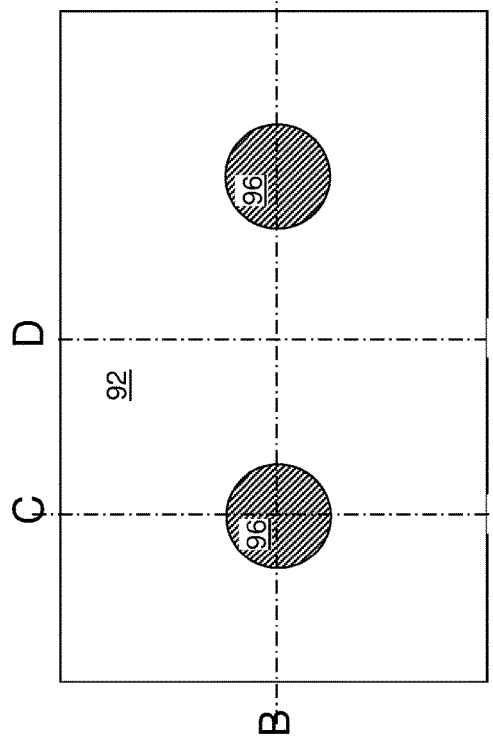
FIG. 24B is a vertical cross-sectional view along the vertical plane B-B' of FIG. 24A.
Figure 24D:
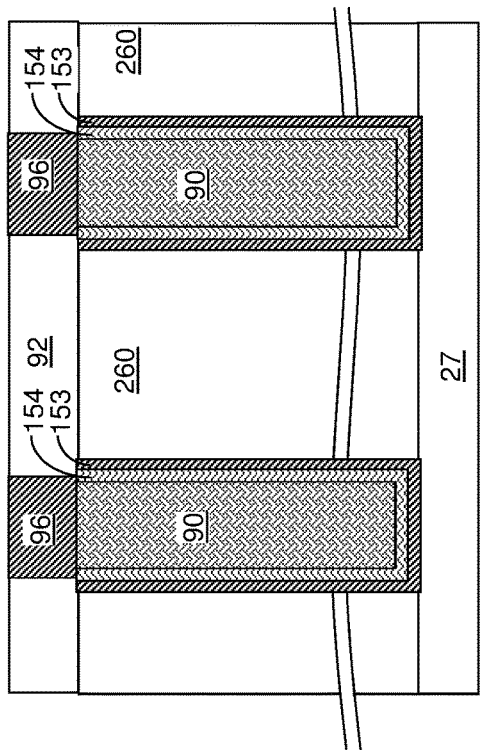
FIG. 24D is a vertical cross-sectional view along the vertical plane D-D' of FIG. 24A.

Referring to FIG. 14, a second exemplary structure according to a second embodiment of the present disclosure is illustrated, which can be derived from the first exemplary structure of FIG. 2 by omitting the ovonic threshold switch material layers 54 and the diffusion barrier material layers 53 from each unit layer stack. Thus, each unit layer stack (32, 46, 52) of the second exemplary structure can consist of an insulating layer 32, an electrically conductive layer 46, and a phase change memory material layer 52.

The total number of repetitions of the unit layer stacks (32, 52, 46) within the vertically repeating sequence of unit layer stacks (32, 52, 46) can be in a range from 4 to 1,024, such as from 8 to 256, although lesser and greater number of repetitions can also be employed. An insulating layer 32 can be provided at the top of the vertically repeating sequence of unit layer stacks (32, 52, 46) as a capping layer.

Referring to FIGS. 15 and 16A-16D, the array of lithographically defined features can be patterned through the vertically repeating sequence of unit layer stacks (32, 52, 46) by a combination of a lithographic patterning process and an etch process. A preferred etch process is a reactive ion etching (RIE) process. The patterned features can form a periodic array structure over the substrate 8. In this case, all materials in the vertically repeating sequence of unit layer stacks (32, 52, 46) are etched in the reactive ion etch process to form line trenches 49.

In an illustrative example, openings are formed through the vertically repeating sequence of unit layer stacks (32, 52, 46), for example, by applying and patterning a photoresist layer (not shown) thereabove, and by transferring the pattern in the photoresist layer through the vertically repeating sequence of unit layer stacks (32, 52, 46) by an anisotropic etch. A plurality of openings vertically extending through the vertically repeating sequence of unit layer stacks (32, 52, 46) is formed.

In one embodiment, the plurality of openings through the vertically repeating sequence of unit layer stacks (32, 52, 46) can include line trenches 49 that laterally extend along the first horizontal direction hd1 or along the second horizontal direction hd2. The areas of line trenches 49 form stripes that cover the areas of the rows of the underlying semiconductor pillar structures (14B, 14C, 14T) or the areas of columns of the underlying semiconductor pillar structures (14B, 14C, 14T). The line trenches 49 can laterally extend along a horizontal direction. The line trenches 49 divide the vertically repeating sequence of unit layer stacks (32, 52, 46) as provided at the processing steps of FIG. 14 into a plurality of vertically repeating sequences of unit layer stacks (32, 52, 46) that are laterally spaced apart by the line trenches 49.

While an embodiment in which the line trenches 49 extend along the second horizontal direction hd2 is illustrated herein, an embodiment in which the line trenches 49 extend along the second horizontal direction hd1 is expressly contemplated herein. The width of each line trench 49 can be in a range from 20 nm to 200 nm, although lesser and greater widths can also be employed. The plurality of line trenches 49 can be formed as a one-dimensional periodic array having a uniform pitch along the widthwise direction of the line trenches 49.

Referring to FIGS. 17A-17D, the material of the electrically conductive layers 46 can be recessed selective to the materials of the phase change memory material layers 52 and the insulating layers 32 by a selective isotropic etch process such as a wet etch process. A lateral recess 59 is formed in each volume from which the material of the electrically conductive layers 46 is laterally recessed. Each lateral recess 59 can laterally extend along the same direction as the lengthwise direction of the line trenches 49. The lateral recess distance of each lateral recess 59 can be in a range from 1 nm to 20 nm, such as from 2 nm to 10 nm, and may vary depending on the location of measurement, i.e., depending on the level at which the lateral thickness is measured. The phase change memory material layers 52 are not recessed and have an edge exposed in the line trenches 49.

Referring to FIGS. 18A-18D, a conformal insulating material layer can be deposited in the lateral recesses 59 and on the surfaces of the line trenches 49 and above the top surfaces of the topmost insulating layers 32. The conformal insulating material layer includes a dielectric material such as silicon oxide, a dielectric metal oxide, or silicon nitride. The thickness of the conformal insulating material layer can be greater than the maximum lateral extent of the lateral recesses 59. An anisotropic etch process can be performed to remove portions of the conformal insulating material layer that are located outside the volumes of the lateral recesses 59. Remaining portions of the conformal insulating material layer fill each of the lateral recesses 59, and constitute insulating spacers 60. The insulating spacers 60 can have a homogeneous composition. Two vertical stacks of insulating spacers 60 are formed around each line trench 49. The lateral recesses 59 are filled with vertical stacks of insulating spacers 60. Physically exposed sidewalls of the insulating spacers 60 can be vertically coincident with sidewalls of the phase change memory material layers 52, and may be vertically coincident with the sidewalls of the insulating layers 32.

In an alternative processing sequence that can replace the processing steps of FIGS. 17A-17D and 18A-18D, physically exposed surface portions of electrically conductive layer 46 is can be selectively oxidized, for example, by anodization, to form the insulation layer 60. In some cases, the anodization process may be same as in the first embodiment.

Referring to FIGS. 19A-19D, an anisotropic etch process can be performed to vertically extend the line trenches 49 (e.g., through the sacrificial cap structures 314). Top surfaces of the top active regions 14T of the underlying two-dimensional array of vertical field effect transistors (14, 16, 18) can be physically exposed at the bottom of the line trenches 49. Physically exposed sidewalls of the insulating spacers 60 can be vertically coincident with sidewalls of the phase change memory material layer 52, and may be vertically coincident with the sidewalls of the insulating layers 32.

Referring to FIGS. 20A-20D, a diffusion barrier material layer 153 can be can be formed on the sidewalls of each line trench 49 by deposition of a diffusion barrier material. The diffusion barrier material layer 153 can have the same composition, and/or the same thickness as, as the diffusion barrier material layer 53 described above. The diffusion barrier material layer 153 suppresses interdiffusion between the phase change memory material layers 52 within the unit layer stacks (32, 52, 46) and ovonic threshold switch material layers to be subsequently formed. For example, the diffusion barrier material layer 153 can include a conductive metallic nitride material (e.g., TiN), a conductive metal (e.g., Ta and/or Ti) or a conductive carbon-containing material such as a thin layer of amorphous carbon or polycrystalline carbon. The thickness of the diffusion barrier material layer 153 can be in a range from 0.5 nm to 10 nm, such as from 1 nm to 5 nm, although lesser and greater thicknesses can also be employed. In some embodiments, the diffusion barrier material layer 153 may be omitted, and direct contact between the respective phase change memory material layers 52 and ovonic threshold switch material layers 154 can be provided.

Ovonic threshold switch material layers 154 can be formed as spacers on sidewalls of the line trenches 49. Specifically, a continuous ovonic threshold switch material layer can be deposited conformally on the sidewalls and the bottom surfaces of the line trenches 49 and over the topmost insulating layers 32. Any conformal deposition method may be used, such as a conformal atomic layer deposition (ALD) method. An anisotropic etch can be performed to remove horizontal portions of the continuous ovonic threshold switch material layer. Each remaining vertical portion of the continuous ovonic threshold switch material layer located over the sidewalls of the line trenches 49 constitutes an ovonic threshold switch material layer 154. The ovonic threshold switch material layer 154 portions located over the sidewalls of the line trenches 49 comprise substantially vertical layer portions. The thickness of each ovonic threshold switch material layer 154 can be in a range from 1 nm to 40 nm, such as from 2 nm to 20 nm, although lesser and greater thicknesses can also be employed. The anisotropic etch may stop on the diffusion barrier material layer 153 as illustrated in FIGS. 20A-20D, or may etch through horizontal portions of the diffusion barrier material layer 153.

A conductive material can be deposited in remaining volumes of the line trenches 49 by a conformal deposition process. The conductive material can include a doped semiconductor material (such as polysilicon) and/or a metallic material (such as an elemental metal (e.g., W), an intermetallic alloy, or a conductive metallic compound such as a metal silicide or a metal nitride (e.g., TiN)). The deposited conductive material forms a conductive material layer, which fills remaining volumes of the line trenches 49 and contacts the ovonic threshold switch material layers 154.

A planarization process can be performed to remove portions of the conductive material layer and the diffusion barrier material layer 153 from above the top surfaces of the topmost insulating layers 32. The planarization process can be performed by chemical mechanical planarization and/or a recess etch. The conductive material layer is divided into multiple discrete portions that are located entirely within a respective one of the line trenches 49. Each discrete remaining portion of the conductive material layer constitutes an electrically conductive rail 90' that extends along a lengthwise direction with a uniform vertical cross-sectional shape in vertical planes that are perpendicular to the lengthwise direction. In one embodiment, the electrically conductive rails 90' can have a respective rectangular vertical cross-sectional shape along vertical planes that are perpendicular to the lengthwise direction. The diffusion barrier material layer 153 can be divided into multiple discrete parts. Thus, each diffusion barrier material layer 153 can be located within a respective line trench. In case the anisotropic etch that forms the ovonic threshold switch material layers 154 stops on the diffusion barrier material layer 153, then each diffusion barrier material layer 153 includes a pair of vertical sidewall portions and a horizontal portion adjoined to bottom edges of the pair of vertical sidewall portions. In case the anisotropic etch that forms the ovonic threshold switch material layers 154 etches through horizontal portions of the diffusion barrier material layer 153 to physically expose top surfaces of the top active regions 14T, then the electrically conductive rails 90' can be formed directly on the top active regions 14T.

Referring to FIGS. 21A-21D, a photoresist layer (not shown) is applied over the vertically repeating sequences of unit layer stacks (32, 52, 46) and the electrically conductive rails 90', and is lithographically patterned to form a two-dimensional array of rectangular openings that overlap with areas of the electrically conductive rails 90'. The pattern in the photoresist layer can be transferred through portions of the ovonic threshold switch material layers 154 and the electrically conductive rails 90' that are not covered by the patterned photoresist layer by performing an anisotropic etch process. The anisotropic etch process removes the materials of the ovonic threshold switch material layers 154 and the electrically conductive rails 90' within areas that are not masked by the photoresist layer. For example, if the electrically conductive rails 90' include doped polysilicon and if the insulating layers 32 include silicon oxide, the chemistry of the anisotropic etch process can be selected to etch polysilicon and the material of the ovonic threshold switch material layers 154 selective to silicon oxide.

In one embodiment, the pattern of the openings in the photoresist layer can be selected such that the patterned photoresist layer covers each portion of the electrically conductive rails 90' that overlies the top active regions 14T. The anisotropic etch process can form a two-dimensional array of pillar cavities, which divides the electrically conductive rails 90' into a two-dimensional array of conductive pillar structures. Each conductive pillar structure is herein referred to as a vertical bit line 90. Each vertical bit line 90 can contact only one of the top active regions 14T of the underlying two-dimensional array of vertical field effect transistors. The photoresist layer can be subsequently removed, for example, by ashing. Each ovonic threshold switch material layer 154 can be divided into multiple ovonic threshold switch material layers 154 that are laterally spaced among one another along the lengthwise direction of the line trenches 49.

The two-dimensional array of vertical bit lines 90 can be arranged as a periodic two-dimensional array having the same periodicity in two horizontal directions as the underlying two-dimensional array of semiconductor pillar structures 14. In this case, the two-dimensional array of pillar cavities can have the same periodicity as the two-dimensional array of vertical bit lines 90.

A dielectric material layer can be deposited into the two-dimensional array pillar cavities to form a two-dimensional array of dielectric pillar structures 260. In this case, the dielectric pillar structures 260 laterally separate the vertical bit lines 90 along the lengthwise direction of the line trenches 49. In other words, the dielectric pillar structures 260 are formed between each neighboring pair of vertical bit lines 90 among the plurality of vertical bit lines 90 that are laterally spaced along the horizontal direction along which the line cavities 49 extend. Each vertical bit line 90 is located within an opening defined by a neighboring pair of vertically repeating sequence of unit layer stacks (32, 52, 46) and a neighboring pair of dielectric pillar structures 260. Each of the insulating spacers 60 contacts a sidewall of a respective one of the plurality of vertical bit lines 90.

The electrically conductive layers 46 function as word lines, and the vertical bit lines 90 accessed through a respective underlying vertical field effect transistor function as vertical bit lines. Upon selection of a word line and a vertical bit line through application of a respective selection voltage to a corresponding electrically conductive layer 46 and a corresponding vertical bit line 90, an electrical current path is defined that includes both a phase change memory material layer 52 and an ovonic threshold switch material layer 154 between the selected word line and the selected vertical bit line. By applying a voltage bias that is high enough to turn on the ovonic threshold switch material layer 154 (i.e., to cause the state of the ovonic threshold switch material layer 154 to change into a low resistance state), the selected phase change memory material layer 52 can be heated. Programming of the state of the selected phase change memory material layer 52 can be effected through control of the waveform of the electrical pulse applied after heating the selected phase change memory material layer 52.

Referring to FIGS. 22A-22D, a first alternative embodiment of the second exemplary structure according to the second embodiment of the present disclosure is illustrated, which is derived from the second exemplary structure of FIG. 14 by forming discrete openings 149 through the vertically repeating sequence of unit layer stacks (32, 52, 46) instead of forming line trenches 49 illustrated in FIGS. 15 and 16A-16D. The horizontal cross-sectional shape of each discrete opening 149 may be circular, oval, polygonal, or of any generally curvilinear closed shape.

The discrete openings 149 can be formed as a two-dimensional array having the same periodicity as the underlying two-dimensional array of vertical field effect transistors. In one embodiment, the areas of the discrete openings 149 can overlap the areas of the top active regions 14T. The discrete openings 149 can be formed, for example, by applying and patterning a photoresist layer over the topmost insulating layer 32 to form openings therein, and by transferring the pattern of the openings in the photoresist layers through the vertically repeating sequence of unit layer stacks (32, 52, 46) by an anisotropic etch. In one embodiment, the bottom surfaces of the discrete openings 149 can be formed on the sacrificial cap structures 314.

Referring to FIGS. 23A-23D, the processing steps of FIGS. 17A-17D and 18A-18D can be performed to form insulating spacers 60. The insulating spacers 60 can have annular shaped, i.e., can have an opening therethrough and thus, can be topologically homeomorphic to a torus.

Subsequently, the processing steps of FIGS. 19A-19D can be performed to vertically extend the discrete openings 149, and to physically expose top surfaces of the top active regions 14T. The inner sidewalls of the insulating spacers 60 can be vertically coincident with sidewalls of the phase change memory material layers 52, and may be vertically coincident with the sidewalls of the insulating layers 32.

The processing steps of FIGS. 20A-20D can be subsequently performed to form diffusion barrier material layers 153, ovonic threshold switch material layers 154, and vertical bit lines 90 within the discrete openings 149. Each ovonic threshold switch material layer 154 can be formed in an annular (e.g., ring-shaped) configuration by depositing a continuous ovonic threshold switch material layer by a conformal deposition process, and by anisotropically etching the continuous ovonic threshold switch material layer.

Each remaining vertical portion of the continuous ovonic threshold switch material layer constitutes an ovonic threshold switch material layer 154. A vertical bit line 90 is formed within each ovonic threshold switch material layer 154 and directly on a respective one of the top active regions 14T.

The electrically conductive layers 46 function as word lines, and the vertical bit lines 60 accessed through a respective underlying vertical field effect transistor function as vertical bit lines. Each layer within the vertically repeating sequence of unit layer stacks (32, 52, 46) can include as many openings therethrough as the total number of vertical bit lines 90.

Referring to FIGS. 24A-24D, a second alternative embodiment of the second exemplary structure according to the second embodiment of the present disclosure is illustrated, which can be derived from any of the second exemplary structure or alternative embodiments described above. Thus, diffusion barrier material layers 153, ovonic threshold switch material layers 154, and vertical bit lines 90 can be formed within line trenches 49 or within discrete openings 149. In this case, an insulating substrate 108, which may consist of an insulating layer or may include a topmost insulating layer and additional material layers (such as a semiconductor substrate with semiconductor devices thereupon and metal interconnect structures thereabove) can be employed in lieu of a two-dimensional array of vertical field effect transistors (14, 16, 18) located over the vertical bit lines 90 described above. Electrical contact to the vertical bit lines 90 can be provided from above, for example, by depositing a contact level dielectric layer 92 and contact via structures 96 extending through the contact level dielectric layer 92 and contacting a top surface of a respective one of the vertical bit lines 90. In case the electrical contacts to the bit lines 90 are made from above, removal of bottom horizontal portions of the ovonic threshold switch material layers 154 is optional. Thus, the ovonic threshold switch material layers 154 may be formed as spacers as in the embodiments described above, or may be formed as a structure including a bottom horizontal plate adjoining at least one sidewall portion.

Figure 25:
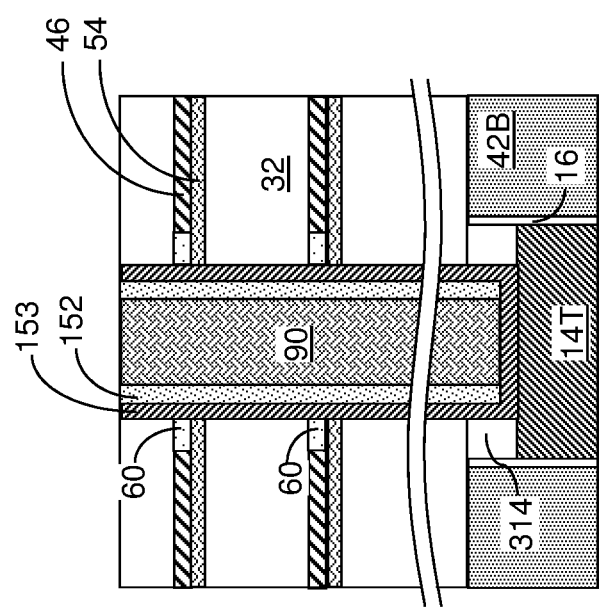
FIG. 25 is a vertical cross-sectional view of the third exemplary structure according to the third embodiment of the present disclosure.

FIG. 25 is a vertical cross-sectional view of the third exemplary structure according to the third embodiment of the present disclosure. In this embodiment, the locations of the phase change memory material layer 52 and the ovonic threshold switch material layer 54 are reversed. In this embodiment, each unit layer stack (32, 54, 46) includes comprises an insulating layer 32, the ovonic threshold switch material layer 54, and an electrically conductive layer (e.g., word line) 46. An optional diffusion barrier material layer 153 and a phase change memory material layer 152 are formed in the openings (e.g., in the line trenches 49 or the discrete openings 149) in the repeating sequence of unit layer stacks (32, 54, 46). The phase change memory material layer 152 can have the same composition as, and/or the same thickness as, the phase change memory material layers 52 described above. The phase change memory material layer 152 can be a conformal layer deposited by any suitable conformal deposition method, such as conformal ALD. The vertical bit lines 90 are formed in the phase change memory material layer 152 in the remaining portions of the openings (49, 149). The reversed locations of the phase change memory material layer 152 and the ovonic threshold switch material layer 54 of FIG. 25 can be formed in the second exemplary structure of FIGS. 21A-21D, in the first alternative embodiment of the second exemplary structure of FIGS. 23A-23D or in the second alternative embodiment of the second exemplary structure of FIGS. 24A-25D.

According to various embodiments of the present disclosure, a phase change memory device containing a phase change memory material layer (52, 152) includes a vertically repeating sequence of unit layer stacks {(32, 54, 53, 52, 46), (32, 52, 46) or (32, 54, 46)} located over a substrate (8 or 108), wherein each of the unit layer stacks {(32, 54, 53, 52, 46), (32, 52, 46) or (32, 54, 46)} comprises an insulating layer 32, at least one of the phase change memory material layer 52 or a threshold switch material layer 54, and an electrically conductive layer 46; a plurality of openings (49 or 149) vertically extending through the vertically repeating sequence; a plurality of vertical bit lines 90 located within a respective one of the plurality of openings; and vertical stacks of insulating spacers 60. Each of the insulating spacers 60 may contact a sidewall of a respective one of the plurality of vertical bit lines 90, may contact a sidewall of a respective one of the electrically conductive layers 46, and may contact a horizontal surface of a respective one of the insulating layers 32.

In one embodiment, the threshold switch material layer comprises an ovonic threshold switch material layer of an ovonic threshold switch. However, other threshold switch material layers can be used instead, such as p-type and n-type semiconductor layers (e.g., silicon layers) of a diode threshold switch.

In one aspect, the first exemplary structure of the first embodiment illustrated in FIGS. 1 to 13D, each of the unit layer stacks (32, 54, 53, 52, 46) comprises both the phase change memory material layer 52 in contact with the electrically conductive layer 46 of the unit layer stack, and the ovonic threshold switch material layer 54 in contact with the plurality of vertical bit lines 90.

In these embodiments of the first exemplary structure, each of the insulating spacers 60 contacts a horizontal surface (e.g., bottom horizontal surface) of a respective one of the insulating layers 32 and a horizontal surface (e.g., top horizontal surface) of the ovonic threshold switch material layer 54 in the same unit layer stack. Optionally, each of the unit layer stacks (32, 54, 53, 52, 46) further comprises a diffusion barrier material layer 53 located between the ovonic threshold switch material layer 54 and the phase change memory material layer 52.

In one embodiment of the first exemplary structure illustrated in FIGS. 6A-6D, each of the insulating spacers 60 comprises a first portion 6A including a dielectric anodic oxide (i.e., an insulating oxide alloy) of a material of the electrically conductive layer 46, and a second portion 6B including a dielectric anodic oxide (i.e., an insulating oxide alloy) of a material of the phase change memory material layers 52. In another embodiment of the first exemplary structure illustrated in FIGS. 10A-10D, each of the insulating spacers 60 has a homogeneous composition (e.g., the entire spacer consists of silicon nitride or silicon oxide).

In another aspect, in the second exemplary structure according to the second embodiment illustrated in FIGS. 14 to 24D, the ovonic threshold switch material layer 154 is located within one of the plurality of openings (49, 149), and laterally encloses a respective one of the plurality of vertical bit lines 90. Thus, the unit layer stack may exclude the ovonic threshold switch material layer 154 in such structures. In this embodiment, each unit layer stack (32, 52, 46) contains the phase change memory material layer 52 which contacts a horizontal surface of the respective insulating layer 32 and contacts a horizontal surface of the conductive material layer 46 within the unit layer stack.

In another aspect, in the third exemplary structure according to the third embodiment illustrated in FIG. 25, the phase change memory material layer 152 is located within one of the plurality of openings (49, 149), contacts the vertical stack of insulating spacers 60 and the ovonic threshold switch material layer 54 in each unit layer stack (32, 54, 46), and laterally encloses a respective one of the plurality of vertical bit lines 90. Thus, the unit layer stack may exclude the phase change memory material layer 152 in such structures. In this embodiment, each unit layer stack (32, 54, 46) contains the ovonic threshold switch material layer 54 which contacts a horizontal surface of the respective insulating layer 32 and a horizontal surface of the conductive material layer 46 within the unit layer stack.

In some embodiments, the plurality of openings comprises line trenches 49 that laterally extend along a horizontal direction; the insulating spacers 60 comprise insulating rail structures that laterally extend along the horizontal direction, and the phase change memory device further comprises dielectric pillar structures 260 located between each neighboring pair of vertical bit lines 90 among the plurality of vertical bit lines 90 that are laterally spaced along the horizontal direction.

In some other embodiments, the plurality of openings comprises a plurality of discrete openings 149 arranged as a two-dimensional array within the vertically repeating sequence of unit layer stacks {(32, 54, 53, 52, 46), (32, 52, 46) or (32, 54, 46)}.

In some embodiments, each of the insulating spacers 60 has a sidewall that is vertically coincident with a sidewall of a respective one of the plurality of openings (49, 149). In some embodiments, each of the phase change memory material layers 52 contacts a horizontal surface of a respective one of the insulating layers 32. In some embodiments, each of the phase change memory material layers 52 contacts a horizontal surface of a conductive material layer 46 within a same unit layer stack {(32, 54, 53, 52, 46) or (32, 52, 46)}.

In one embodiment, an electrical system contains a storage device comprising at least one phase change memory device described above and a selector device to electrically access a plurality of memory cells in the phase change memory device.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A phase change memory device containing a phase change memory material layer, the device comprising:
   a vertically repeating sequence of unit layer stacks located over a substrate, wherein each of the unit layer stacks comprises an insulating layer, at least one of the phase change memory material layer or a threshold switch material layer, and an electrically conductive word line layer;
   a plurality of openings vertically extending through the vertically repeating sequence;
   a plurality of vertical bit lines located within a respective one of the plurality of openings; and
   vertical stacks of insulating spacers, wherein each of the insulating spacers laterally surrounds a respective one of the plurality of vertical bit lines, and contacts a sidewall of a respective one of the electrically conductive word line layers;
   wherein the phase change memory device further comprises at least one feature selected from:
   (i) a first feature in which the threshold switch material layer is located within one of the plurality of openings, contacts the vertical stack of insulating spacers and the phase change memory material layer in each unit layer stack, and laterally encloses a respective one of the plurality of vertical bit lines; and
      each unit layer stack contains the phase change memory material layer which contacts a horizontal surface of the respective insulating layer and a horizontal surface of a conductive material layer within the unit layer stack; or
   (ii) a second feature in which the phase change memory material layer is located within one of the plurality of openings, contacts the vertical stack of insulating spacers and the threshold switch material layer in each unit layer stack, and laterally encloses a respective one of the plurality of vertical bit lines; and
      each unit layer stack contains the threshold switch material layer which contacts a horizontal surface of the respective insulating layer and a horizontal surface of the conductive material layer within the unit layer stack; or
   (iii) a third feature in which the plurality of openings comprises line trenches that laterally extend along a horizontal direction;
      the insulating spacers comprise insulating rail structures that laterally extend along the horizontal direction; and
      the phase change memory device further comprises dielectric pillar structures located between each neighboring pair of vertical bit lines among the plurality of vertical bit lines that are laterally spaced along the horizontal direction; or
   (iv) a fourth feature in which the threshold switch material layer comprises an ovonic threshold switch material layer; and
      the plurality of openings comprise a plurality of discrete openings arranged as a two-dimensional array in the vertically repeating sequence of unit layer stacks.

2. The phase change memory device of claim 1, wherein each of the unit layer stacks comprises both the phase change memory material layer in contact with the electrically conductive word line layer of the unit layer stack, and the threshold switch material layer in contact with the plurality of vertical bit lines.

3. The phase change memory device of claim 2, wherein each of the insulating spacers contacts a horizontal surface of a respective one of the insulating layers and a horizontal surface of the threshold switch material layer in the same unit layer stack.

4. The phase change memory device of claim 2, wherein each of the insulating spacers comprises a first portion including an insulating oxide alloy of a material of the electrically conductive word line layer and a second portion including an insulating oxide alloy of a material of the phase change memory material layer.

5. The phase change memory device of claim 2, wherein each of the insulating spacers has a homogeneous composition.

6. The phase change memory device of claim 2, wherein each of the unit layer stacks further comprises a diffusion barrier material layer located between the threshold switch material layer and the phase change memory material layer.

7. The phase change memory device of claim 1, wherein the at least one feature comprises the first feature.

8. The phase change memory device of claim 1, wherein the at least one feature comprises the second feature.

9. The phase change memory device of claim 1, wherein the at least one feature comprises the third feature.

10. The phase change memory device of claim 1, wherein the at least one feature comprises the fourth feature.

11. The phase change memory device of claim 1, wherein the at least one feature comprises the first feature.

12. A method of manufacturing a phase change memory device containing a phase change memory material layer, the method comprising:
   forming a vertically repeating sequence of unit layer stacks over a substrate, wherein each of the unit layer stacks comprises an insulating layer, at least one of the phase change memory material layer or a threshold switch material layer, and an electrically conductive word line layer;
   forming a plurality of openings vertically extending through the vertically repeating sequence of unit layer stacks;
   forming vertical stacks of insulating spacers around the plurality of openings at levels of the electrically conductive word line layers, wherein each of the insulating spacers contacts sidewalls of a respective one of the electrically conductive word line layers; and
   forming a plurality of vertical bit lines located within a respective one of the plurality of openings; and
   wherein the method further comprises at least one feature selected from:
      (i) a first feature comprising laterally recessing sidewalls of the electrically conductive layers selective to at least one of the phase change memory material layer or the threshold switch material layer, wherein the vertical stacks of insulating spacers are formed within the lateral recesses; or
      (ii) a second feature in which the plurality of openings comprises line trenches that laterally extend along a horizontal direction;
         the insulating spacers comprise insulating rail structures that laterally extend along the horizontal direction; and
         the method further comprises forming a two-dimensional array of dielectric pillar structures, wherein the dielectric pillar structures are formed between each neighboring pair of vertical bit lines among the plurality of vertical bit lines that are laterally spaced along the horizontal direction; or
      (iii) a third feature in which the threshold switch material layer comprises an ovonic threshold switch material layer;
         the plurality of openings comprises a plurality of discrete openings arranged as a two-dimensional array; and
         the insulating spacers have annular shapes.

13. The method of claim 12, wherein:
the at least one feature comprises the first feature;
each of the unit layer stacks comprises a respective insulating layer, a respective phase change memory material layer, and a respective electrically conductive layer;
the threshold switch material layers are formed within a respective one of the plurality of openings in contact with the vertical stacks of the insulating spacers and with the phase change memory material layers; and
each of the plurality of vertical bit lines is formed within a cavity within a respective one of the threshold switch material layers.

14. The method of claim 12, wherein:
the at least one feature comprises the first feature;
each of the unit layer stacks comprises a respective insulating layer, a respective threshold switch material layer, and a respective electrically conductive layer;
the phase change memory material layer are formed within a respective one of the plurality of openings in contact with the vertical stacks of the insulating spacers and with the threshold switch material layers; and
each of the plurality of vertical bit lines is formed within a cavity within a respective one of the phase change memory material layers.

15. The method of claim 12, wherein:
the at least one feature comprises the first feature;
each of the unit layer stacks comprises a respective insulating layer, a respective threshold switch material layer, and a respective electrically conductive layer;
a diffusion barrier material layer and the phase change memory material layer are formed within a respective one of the plurality of openings, such that the diffusion barrier material layer is in contact with the vertical stacks of the insulating spacers and with the threshold switch material layers; and
each of the plurality of vertical bit lines is formed within a cavity within a respective one of the phase change memory material layers.

16. The method of claim 12, wherein the at least one feature comprises the second feature.

17. The method of claim 12, wherein the at least one feature comprises the third feature.

18. The method of claim 12, wherein:
each of the insulating spacers contacts a sidewall of a respective one of the plurality of vertical bit lines;
each of the unit layer stacks comprises both the phase change memory material layer and the threshold switch material layer; and
the plurality of vertical bit lines are formed in contact with the threshold switch material layers.

19. The method of claim 18, wherein forming the vertical stacks of insulating spacers comprises selectively anodizing surface portions of the electrically conductive layers and the phase change memory material layers around each of the plurality of openings without anodizing the threshold switch material layers.

20. The method of claim 18, wherein forming the vertical stacks of insulating spacers comprises:
laterally recessing sidewalls of the electrically conductive layers and the phase change memory material layers selective to the threshold switch material layers to form lateral recesses;
depositing a conformal insulating material in the plurality of openings and in the lateral recesses; and
anisotropically etching the conformal insulating material layer, wherein remaining portions of the conformal insulating material layer located in the lateral recesses constitute the vertical stacks of insulating spacers.

21. The method of claim 18, wherein each of the unit layer stacks further comprises a diffusion barrier material layer located between the threshold switch material layer and the phase change memory material layer.

22. A phase change memory device containing a phase change memory material layer, the device comprising:
- a vertically repeating sequence of unit layer stacks located over a substrate, wherein each of the unit layer stacks comprises an insulating layer, at least one of the phase change memory material layer or a threshold switch material layer, and an electrically conductive word line layer;
- a plurality of openings vertically extending through the vertically repeating sequence;
- a plurality of vertical bit lines located within a respective one of the plurality of openings; and
- vertical stacks of insulating spacers, wherein each of the insulating spacers laterally surrounds a respective one of the plurality of vertical bit lines, and contacts a sidewall of a respective one of the electrically conductive word line layers,
- wherein each of the unit layer stacks comprises both the phase change memory material layer in contact with the electrically conductive word line layer of the unit layer stack, and the threshold switch material layer in contact with the plurality of vertical bit lines; and
- wherein the phase change memory device further comprises at least one feature selected from:
  (i) a first feature in which each of the insulating spacers contacts a horizontal surface of a respective one of the insulating layers and a horizontal surface of the threshold switch material layer in the same unit layer stack; or
  (ii) a second feature in which each of the insulating spacers comprises a first portion including an insulating oxide alloy of a material of the electrically conductive word line layer and a second portion including an insulating oxide alloy of a material of the phase change memory material layer; or
  (iii) a third feature in which each of the insulating spacers has a homogeneous composition; or
  (iv) the fourth feature in which each of the unit layer stacks further comprises a diffusion barrier material layer located between the threshold switch material layer and the phase change memory material layer.

23. The phase change memory device of claim 22, wherein the at least one feature comprises the second feature.

24. The phase change memory device of claim 22, wherein the at least one feature comprises the third feature.

25. The phase change memory device of claim 22, wherein the at least one feature comprises the fourth feature.

26. A method of manufacturing a phase change memory device containing a phase change memory material layer, the method comprising:
- forming a vertically repeating sequence of unit layer stacks over a substrate, wherein each of the unit layer stacks comprises an insulating layer, at least one of the phase change memory material layer or a threshold switch material layer, and an electrically conductive word line layer;
- forming a plurality of openings vertically extending through the vertically repeating sequence of unit layer stacks;
- forming vertical stacks of insulating spacers around the plurality of openings at levels of the electrically conductive word line layers, wherein each of the insulating spacers contacts sidewalls of a respective one of the electrically conductive word line layers; and
- forming a plurality of vertical bit lines located within a respective one of the plurality of openings,
wherein:
- each of the insulating spacers contacts a sidewall of a respective one of the plurality of vertical bit lines;
- each of the unit layer stacks comprises both the phase change memory material layer and the threshold switch material layer;
- the plurality of vertical bit lines are formed in contact with the threshold switch material layers; and
- the method further comprises at least one feature selected from:
  (i) a first feature comprising forming the vertical stacks of insulating spacers comprises selectively anodizing surface portions of the electrically conductive layers and the phase change memory material layers around each of the plurality of openings without anodizing the threshold switch material layers; or
  (ii) a second feature comprising forming the vertical stacks of insulating spacers comprises:
    - laterally recessing sidewalls of the electrically conductive layers and the phase change memory material layers selective to the threshold switch material layers to form lateral recesses;
    - depositing a conformal insulating material in the plurality of openings and in the lateral recesses; and
    - anisotropically etching the conformal insulating material layer, wherein remaining portions of the conformal insulating material layer located in the lateral recesses constitute the vertical stacks of insulating spacers; or
  (iii) a third feature wherein each of the unit layer stacks further comprises a diffusion barrier material layer located between the threshold switch material layer and the phase change memory material layer.

27. The method of claim 26, wherein the at least one feature comprises the first feature.

28. The method of claim 26, wherein the at least one feature comprises the second feature.

29. The method of claim 26, wherein the at least one feature comprises the third feature.

* * * * *